(12) United States Patent
Kim et al.

(10) Patent No.: US 12,393,294 B2
(45) Date of Patent: Aug. 19, 2025

(54) ELECTRONIC APPARATUS

(71) Applicant: Samsung Display Co., Ltd., Yongin-Si (KR)

(72) Inventors: Sunghwan Kim, Ulsan (KR); Hyun Jae Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 216 days.

(21) Appl. No.: 18/089,621

(22) Filed: Dec. 28, 2022

(65) Prior Publication Data
US 2023/0307819 A1 Sep. 28, 2023

(30) Foreign Application Priority Data
Mar. 23, 2022 (KR) .................. 10-2022-0036273

(51) Int. Cl.
*H01Q 9/04* (2006.01)
*G06F 3/041* (2006.01)
*H01Q 21/08* (2006.01)
*G06F 3/044* (2006.01)

(52) U.S. Cl.
CPC ......... *G06F 3/0412* (2013.01); *H01Q 9/0407* (2013.01); *H01Q 21/08* (2013.01); *G06F 3/0445* (2019.05); *G06F 3/0446* (2019.05); *G06F 2203/04111* (2013.01)

(58) Field of Classification Search
None
See application file for complete search history.

(56) References Cited

U.S. PATENT DOCUMENTS

| | | | |
|---|---|---|---|
| 8,896,991 B2* | 11/2014 | Ternus | H05K 1/0281 361/679.55 |
| 11,209,874 B2 | 12/2021 | Kim et al. | |
| 2008/0100519 A1* | 5/2008 | Ku | H01Q 1/243 343/702 |
| 2010/0321325 A1* | 12/2010 | Springer | H01Q 1/243 345/173 |
| 2012/0329524 A1* | 12/2012 | Kent | G06F 3/0443 455/566 |
| 2019/0319367 A1* | 10/2019 | Edwards | H01Q 21/061 |
| 2021/0311603 A1* | 10/2021 | Baki | G06F 3/046 |
| 2022/0115767 A1* | 4/2022 | Lee | H10K 59/40 |
| 2022/0271441 A1* | 8/2022 | Lee | H01Q 9/0407 |
| 2022/0320737 A1* | 10/2022 | Oh | H01Q 1/40 |
| 2023/0055640 A1* | 2/2023 | Choi | H01Q 21/08 |
| 2023/0198128 A1* | 6/2023 | Oh | H04M 1/0277 343/702 |
| 2023/0208011 A1* | 6/2023 | Lee | H01Q 1/364 343/720 |
| 2024/0179850 A1* | 5/2024 | Jung | H05K 3/429 |

FOREIGN PATENT DOCUMENTS

| | | |
|---|---|---|
| KR | 10-2021-0054091 A | 5/2021 |
| KR | 10-2285108 B1 | 8/2021 |

* cited by examiner

*Primary Examiner* — Parul H Gupta
(74) *Attorney, Agent, or Firm* — Innovation Counsel LLP

(57) ABSTRACT

An electronic apparatus including a display panel including a display region, an antenna layer disposed on the display panel and including a first surface overlapping the display region and a first side surface connected to the first surface, and a circuit board connected to the antenna layer. The circuit board includes a second surface partially facing the first surface of the antenna layer and a second side surface connected to the second surface, and the second side surface faces the first side surface.

11 Claims, 12 Drawing Sheets

ELECTRONIC APPARATUS

CROSS-REFERENCE TO RELATED APPLICATIONS

This U.S. non-provisional patent application claims priority under 35 U.S.C. § 119 to Korean Patent Application No. 10-2022-0036273, filed on Mar. 23, 2022, the entire contents of which are hereby incorporated by reference.

BACKGROUND

The present disclosure herein relates to an electronic apparatus, and more particularly, to an electronic apparatus including an antenna.

Electronic apparatuses, such as a television, a mobile phone, a tablet, a computer, a navigation system, and a game machine, may include a display module in order to provide an image to a user. In addition to the display module, an electronic apparatus may include various electronic modules such as an antenna module, a camera module, or a battery module. The antenna module may support wireless communication such as a network, Wi-Fi, and Bluetooth for the electronic apparatus. The antenna module may be disposed inside the electronic apparatus or may transmit/receive signals in a specific frequency range by using a metal material, which forms the outer shape of the electronic apparatus, as a radiator.

In recent years, as electronic apparatuses have become highly functional, thin, and miniaturized for user convenience and portability, it is required to conduct research on electronic apparatuses capable of efficiently mounting electronic modules while maintaining reliability.

SUMMARY

The present disclosure provides an antenna layer and a circuit board connected to the antenna layer having improved reliability by preventing damage to the antenna layer included in an electronic apparatus.

The present disclosure also provides an electronic apparatus including an antenna layer and having a reduced bezel region.

An embodiment of the inventive concept provides an electronic apparatus including: a display panel including a display region; an antenna layer disposed on the display panel and including a first surface overlapping the display region and a first side surface connected to the first surface; and a circuit board connected to the antenna layer, wherein the circuit board includes a second surface partially facing the first surface of the antenna layer and a second side surface connected to the second surface. The second side surface may face the first side surface.

In an embodiment, the first side surface may include a plurality of first grooves, and the second side surface may include a plurality of second grooves formed to engage with the plurality of first grooves.

In an embodiment, each of the plurality of first grooves and the plurality of second grooves may include a curved surface.

In an embodiment, the plurality of first grooves and the plurality of second grooves may have a polygonal shape.

In an embodiment, the antenna layer may include a base film; a plurality of antennas disposed on the base film; and a plurality of antenna pads electrically connected to the plurality of antennas, respectively.

In an embodiment, the first side surface may be defined by the base film.

In an embodiment, the circuit board may include a base layer; a conductive layer disposed on the base layer and including connection pads electrically connected to the plurality of antenna pads, respectively; and a cover layer disposed on the conductive layer and exposing the connection pads.

In an embodiment, the second side surface may be defined by the cover layer.

In an embodiment, the electronic apparatus may further include a plurality of sensing electrodes disposed on the display panel, and the plurality of antennas may overlap the plurality of sensing electrodes.

In an embodiment, the electronic apparatus may further include a plurality of sensing electrodes disposed on the display panel, and the plurality of antennas may be disposed on the same layer as at least a portion of the plurality of sensing electrodes.

In an embodiment, the antenna layer may include a bent portion which is bent at a curvature, and the first side surface may correspond to an end of the bent portion.

In an embodiment, the circuit board may be bent so that at least a portion of the circuit board overlaps the display panel on the second surface.

In an embodiment, the first side surface may be in direct contact with the second side surface.

In an embodiment of the inventive concept, an electronic apparatus includes: a display panel including a display region; an antenna layer disposed on the display panel; and a circuit board connected to the antenna layer. A first side surface of the antenna layer may include a plurality of first grooves, and a second side surface of the circuit board may include a plurality of second grooves facing the plurality of first grooves and having a shape corresponding to the plurality of first grooves.

In an embodiment, the plurality of first grooves may engage with the plurality of second grooves.

In an embodiment of the inventive concept, an electronic apparatus includes: a display panel configured to display an image; an antenna layer disposed on the display panel and including a first surface and a first side surface connected to the first surface; and a circuit board disposed adjacent to the first side surface of the antenna layer and connected to the antenna layer, the circuit board including a second surface partially facing the first surface, wherein the circuit board including a stepped portion having a step difference and the stepped portion faces the first side surface.

In an embodiment, the second surface of the circuit board may include a first partial surface which contacts with the first surface of the antenna layer and a second partial surface spaced apart from the first surface, and the step difference may correspond to a distance between the first partial surface and the second partial surface in the thickness direction of the circuit board.

In an embodiment, the second partial surface may be bent so that at least a portion of the circuit board faces the display panel on the second surface.

In an embodiment, the stepped portion may directly contact the first side surface.

In an embodiment, the first side surface may include a plurality of first grooves, and the stepped portion may include a plurality of second grooves corresponding to the plurality of first grooves.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
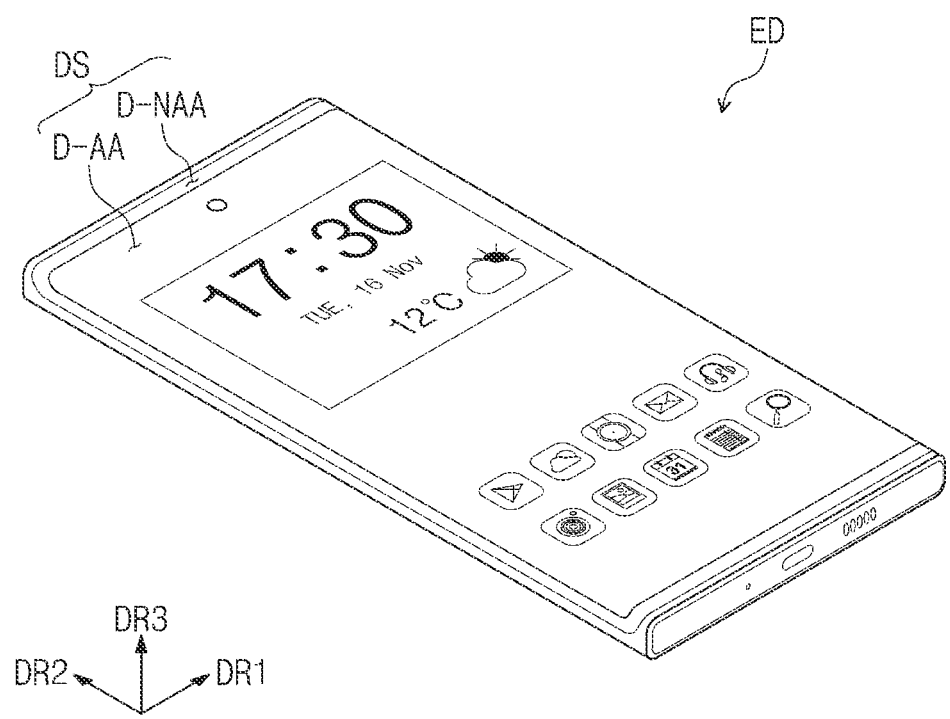
FIG. 1 is a perspective view of an electronic apparatus according to an embodiment of the inventive concept.

In the present inventive concept, various modifications can be made, various forms can be used and specific embodiments will be illustrated in the drawings and described in detail in the text. However, this is not intended to limit the present inventive concept to a specific form disclosed, and it will be understood that all changes, equivalents, and substitutes which fall in the spirit and technical scope of the present inventive concept should be included.

In this specification, it will be understood that when an element (or region, layer, portion, etc.) is referred to as "being on", "connected to" or "coupled to" another element, it can be directly on, connected or coupled to the other element, or intervening elements may be present between them.

Like reference numerals refer to like elements throughout. In addition, in the drawings, the thicknesses, ratios, and dimensions of elements are exaggerated for effective description of the technical contents.

It will be understood that, although the terms first, second, etc. may be used herein to describe various elements, these elements should not be limited by these terms. These terms are only used to distinguish one element from another element. For example, a first element could be termed a second element without departing from the scope of the present inventive concept. Similarly, the second element may also be referred to as the first element. The terms of a singular form include plural forms unless otherwise specified.

Terms, such as "below", "lower", "above", "upper" and the like, are used herein for ease of description to describe one element's relation to another element(s) as illustrated in the figures. The above terms are relative concepts and are described based on the directions indicated in the drawings.

It will be understood that the terms "include" and/or "have", when used in this specification, specify the presence of stated features, integers, steps, operations, elements, components and/or groups thereof, but do not preclude the presence or addition of one or more other features, integers, steps, operations, elements, components, and/or groups thereof Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an electronic apparatus according to embodiments of the inventive concept will be described with reference to the accompanying drawings.

The electronic apparatus ED may be activated according to an electrical signal and display an image. The electronic apparatus ED may be a large-sized device such as a television and an external billboard, or a small or medium-sized device such as a monitor, a mobile phone, a tablet, a navigation system, and a game machine, and the electronic apparatus ED according to an embodiment of the inventive concept may be a wearable device. The electronic apparatus ED may be a device capable of wireless communication such as a network, Wi-Fi, or Bluetooth. The electronic apparatus ED is not limited to any one embodiment as long as it does not depart from the concept of the present inventive concept. FIG. 1 illustrates that the electronic apparatus ED is a mobile phone.

Referring to FIG. 1, the electronic apparatus ED may have a rectangular shape having short sides extending in a first direction DR1 and long sides extending in a second direction DR2 in a plan view. However, the embodiment of the inventive concept is not limited thereto, and the electronic apparatus ED may have various shapes such as a circular shape and a polygonal shape.

The electronic apparatus ED may display an image in a third direction DR3 through a display surface DS parallel to a plane defined by the first and second directions DR1 and DR2. The third direction DR3 may be substantially parallel to the normal direction of the display surface DS of the electronic apparatus ED. In an embodiment of the inventive concept, the display surface DS may correspond to a front surface of the electronic apparatus ED.

In this embodiment, the front surface (or upper surface) and the rear surface (or lower surface) of each constituent (or each unit) may be defined based on a direction in which the image is displayed. The front surface and the rear surface may be opposite to each other in the third direction DR3, and the normal direction of each of the front surface and the rear surface may be parallel to the third direction DR3. A separation distance between the front surface and the rear surface defined along the third direction DR3 may correspond to the thickness of a constituent (or an unit).

In this specification, the expression "in a plan view" may be defined as a state of being viewed from the third direction DR3. In this specification, the expression "in a cross sectional view" may be defined as a state of being viewed from the first direction DR1 or the second direction DR2. Meanwhile, directions indicated by the first to third directions DR1, DR2, and DR3 are relative concepts and may be converted into other directions.

FIG. 1 exemplarily illustrates the electronic apparatus ED having a planar display surface DS. However, the shape of the display surface DS of the electronic apparatus ED is not limited thereto and may be a curved shape or a three-dimensional shape.

The electronic apparatus ED may be a flexible device. The expression "being flexible" refers to a property of being bendable, and a flexible structure may include everything from a completely foldable structure to a structure that can be bent to the level of several nanometers. For example, a flexible electronic apparatus ED may be a curved device or a foldable device. Without being limited thereto, the electronic apparatus ED may be a rigid one.

The display surface DS of the electronic apparatus ED may include a display portion D-AA and a non-display portion D-NAA. The display portion D-AA may be a portion on which the image is displayed. The shape of the display portion D-AA is not limited to that illustrated in FIG. 1 and may have various shapes according to the design of the electronic apparatus ED.

The non-display portion D-NAA may be a portion on which the image is not displayed. The non-display portion D-NAA may have a predetermined color and be a portion in which light is blocked. The non-display portion D-NAA may be disposed adjacent to the display portion D-AA. For example, the non-display portion D-NAA may be disposed outside the display portion D-AA so as to surround the display portion D-AA. However, this is illustrated as an example, and the non-display portion D-NAA may be disposed adjacent to only one side of the display portion D-AA or may be disposed on a side surface of the electronic apparatus ED. However, the embodiment of the inventive concept is not limited thereto, and the non-display portion D-NAA may be omitted.

Figure 2A:
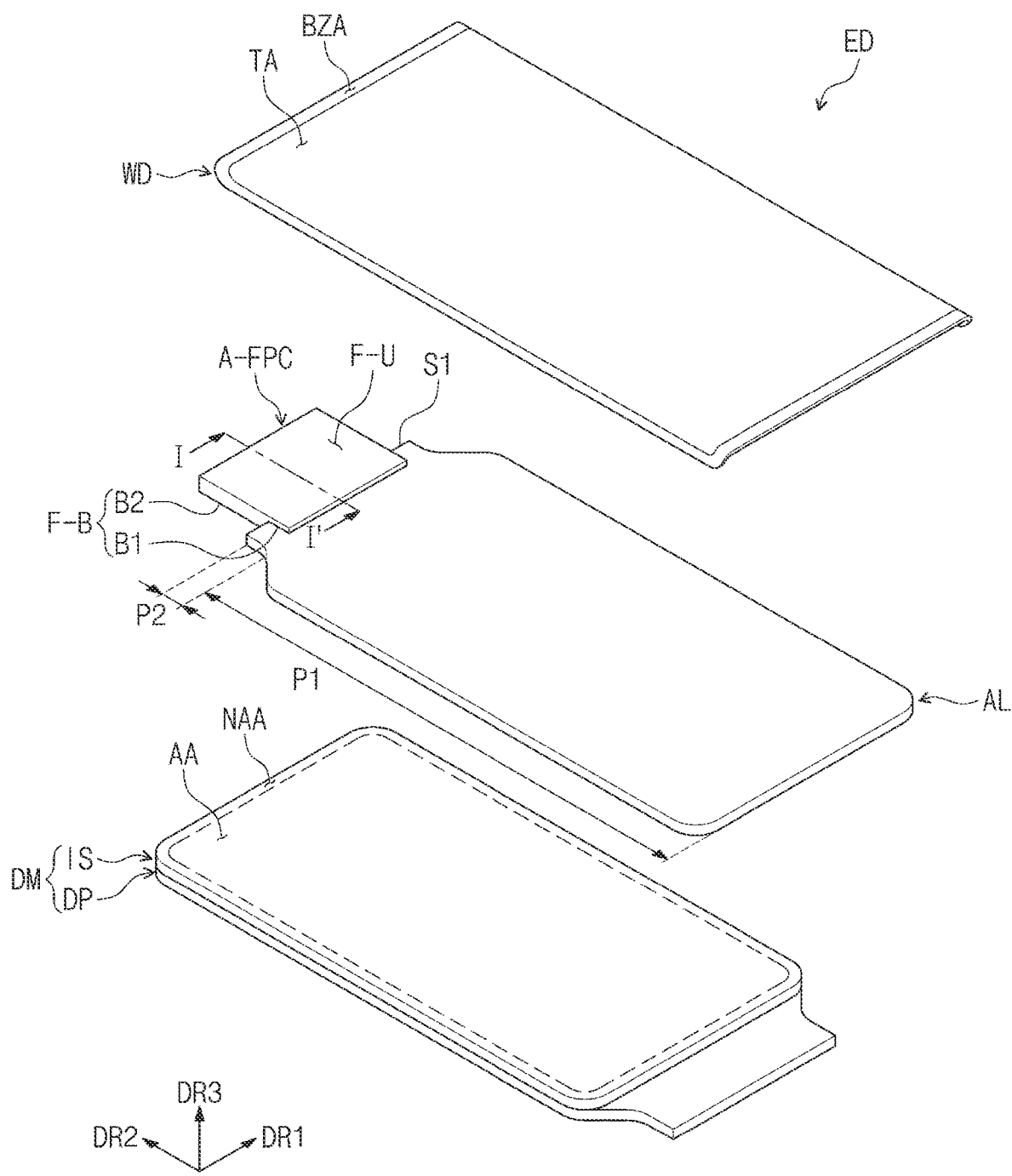
FIG. 2A is an exploded perspective view of the electronic apparatus according to an embodiment of the inventive concept.
Figure 2B:
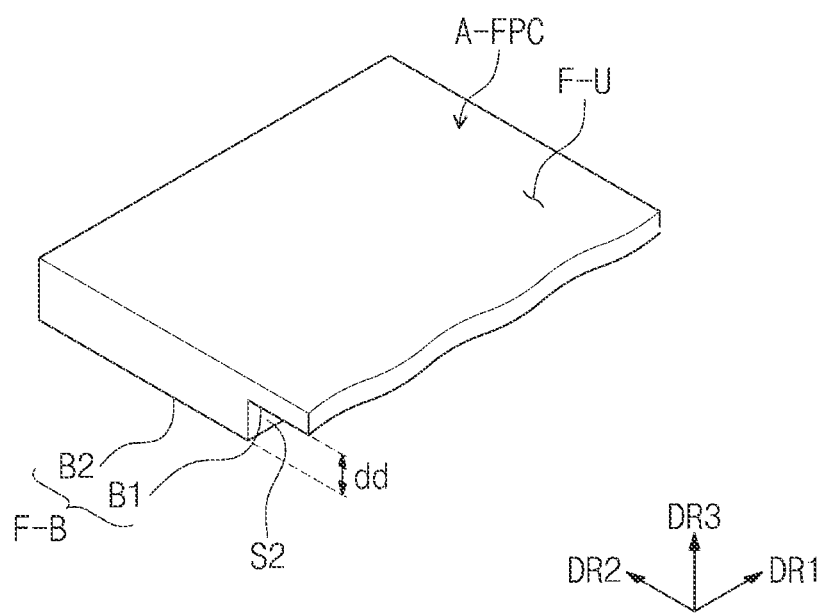
FIG. 2B is a perspective view of a circuit board according to an embodiment of the inventive concept illustrated in FIG. 2A.

FIG. 2A is an exploded perspective view of the electronic apparatus illustrated in FIG. 1 according to an embodiment of the inventive concept. FIG. 2B is a perspective view of a circuit board according to an embodiment of the inventive concept illustrated in FIG. 2A. FIG. 2B illustrates the circuit board A-FPC separated from an antenna layer AL.

Referring to FIG. 2A, the electronic apparatus ED may include a window WD, an antenna layer AL, a circuit board A-FPC, and a display module DM.

The window WD may be disposed on the display module DM and the antenna layer AL. The window WD may have a shape corresponding to the shapes of the display module DM and the antenna layer AL, which are disposed under the window WD, and cover the display module DM and the antenna layer AL. The window WD may protect the display module DM and the antenna layer AL from external impacts or scratches.

The window WD may include an optically transparent insulating material. For example, the window WD may include glass, sapphire, or plastic. The window WD may have a single-layered or multi-layered structure. A multi-layered window WD may include a plurality of plastic films bonded to each other by an adhesive, or a glass substrate and a plastic film bonded to each other by an adhesive. Meanwhile, the window WD may further include a functional layer such as an anti-fingerprint layer, a phase control layer, and a hard coating layer which are disposed on a transparent substrate.

The front surface of the window WD may correspond to the display surface DS (refer to FIG. 1) of the electronic apparatus ED described above. The front surface of the window WD may include a transmission region TA and a bezel region BZA.

The transmission region TA may be an optically transparent region. The transmission region TA may correspond to the display portion D-AA (refer to FIG. 1) of the electronic apparatus ED. A user may visually recognize an image emitted through the transmission region TA of the window WD.

The bezel region BZA may be a region having a light transmittance lower than that of the transmission region TA. The bezel region BZA may correspond to a region in which a material having a predetermined color is deposited, coated, or printed on a transparent substrate. The bezel region BZA may correspond to the non-display portion D-NAA (refer to FIG. 1) of the electronic apparatus ED. The bezel region BZA may prevent elements of the display module DM and the antenna layer AL, which are disposed to overlap the bezel region BZA, from being viewed from the outside.

The bezel region BZA may define the shape of the transmission region TA. The bezel region BZA may be disposed adjacent to and surround the transmission region TA. However, the shape of the bezel region BZA is not limited thereto, and in an embodiment of the inventive concept, the bezel region BZA may be omitted.

The display module DM may be disposed under the window WD. According to an embodiment of the inventive concept, the display module DM may include a display panel DP and an input sensor IS disposed on the display panel DP.

The display module DM may include a display region AA and a non-display region NAA. The display region AA may be activated according to an electrical signal. The display module DM may display an image through the display region AA or sense an external input. The display region AA of the display module DM may overlap the transmission region TA. Meanwhile, in this specification, the expression "overlapping a region/portion and a region/portion to each other" is not limited to having a same area and/or a same shape.

The non-display region NAA may be disposed adjacent to the display region AA. For example, the non-display region NAA may surround the display region AA. However, the embodiment of the inventive concept is not limited thereto, and the non-display region NAA may be defined in various shapes.

The non-display region NAA may be a region in which signal lines, pads, and the like which provide various electrical signals to the elements disposed in the display region AA, and driving circuits and driving lines for driving the elements disposed in the display region AA are disposed. The non-display region NAA of the display module DM may overlap the bezel region BZA. The bezel region BZA may prevent the elements of the display module DM disposed in the non-display region NAA from being viewed from the outside.

The display panel DP according to an embodiment of the inventive concept may be a light-emitting display panel, but is not particularly limited thereto. For example, the display panel DP may be an organic light-emitting display panel, an inorganic light-emitting display panel, or a quantum dot light-emitting display panel. A light-emitting layer of the organic light-emitting display panel may contain an organic light-emitting material, and a light-emitting layer of the inorganic light-emitting display panel may contain an inorganic light-emitting material. A light-emitting layer of the quantum dot light-emitting display panel may contain quantum dots, quantum rods, and the like. Hereinafter, the display panel DP will be described as an organic light-emitting display panel.

The input sensor IS may sense an external input applied from the outside of the electronic apparatus ED. The external input may have various forms, such as externally provided pressure, temperature, light, and the like. The external input may include an input applied in proximity to the electronic apparatus ED (e.g., hovering) as well as an input that makes contact with the electronic apparatus ED (e.g., touch by a user's hand or a pen).

The input sensor IS may obtain a coordinate information of an external input. The driving method of the input sensor IS may be applied in various ways, such as a capacitive method, a resistive film method, an infrared method, or a pressure method, but is not limited thereto. In addition, in the display module DM according to an embodiment of the inventive concept, the input sensor IS may be omitted.

The input sensor IS may be directly disposed on the display panel DP. The input sensor IS may contact with the uppermost layer of the display panel DP. The input sensor IS may be formed through a continuous process together with the display panel DP. That is, the elements of the input sensor IS may be formed on a base surface provided by the display panel DP through the continuous process. However, the embodiment of the inventive concept is not limited thereto, and the display panel DP and the input sensor IS may be respectively formed through separate processes and then coupled to each other by an additional adhesive member.

The antenna layer AL may be disposed between the window WD and the display module DM. The antenna layer AL may transmit, receive, or transmit/receive a wireless communication signal, for example, a radio frequency signal. The antenna layer AL may be referred to as a radio frequency device. The antenna layer AL may include a plurality of antennas (or a plurality of radiating portions), and the plurality of antennas transmit, receive, or transmit/receive a same frequency band, or transmit, receive, or transmit/receive different frequency bands.

The antenna layer AL may include a first portion P1 overlapping the display region AA of the display module DM and a second portion P2 extending from the first portion P1. A portion of the second portion P2 of the antenna layer AL may overlap the non-display region NAA of the display module DM. Although FIG. 2A illustrates the second portion P2 in a state prior to being bent, the second portion P2 of the antenna layer AL may be bent at a curvature.

Since the first portion P1 of the antenna layer AL is disposed to overlap the display region AA, the area of a region in which the antenna layer AL is disposed may be sufficiently secured although the electronic apparatus ED becomes smaller or thinner. That is, as the antenna layer AL is disposed to correspond to the display region AA of the display module DM having a predetermined area, the region in which the antenna layer AL is disposed may be easily secured although the non-display region NAA of the display module DM is reduced. Accordingly, it is possible to provide the electronic apparatus ED including the antenna layer AL with a reduced bezel region BZA.

The antenna layer AL may include an upper surface, a lower surface, and side surfaces connecting the upper surface and the lower surface to each other. The upper and lower surfaces of the antenna layer AL may be parallel to each of the first direction DR1 and the second direction DR2. One side surface S1 of the side surfaces of the antenna layer AL may correspond to an end of the second portion P2. The one side surface S1 of the antenna layer AL may be defined as a first side surface S1 of the antenna layer AL. The first side surface S1 may be a surface substantially parallel to each of the first direction DR1 and the third direction DR3.

Referring to FIG. 2A, the circuit board A-FPC may be disposed adjacent to the end of the second portion P2 of the antenna layer AL. The circuit board A-FPC may be connected to the antenna layer AL. For example, the circuit board A-FPC may be physically and electrically connected to the antenna layer AL. The circuit board A-FPC electrically connected to the antenna layer AL may transmit an electrical signal to the antenna layer AL.

The circuit board A-FPC may include signal lines transmitting a driving signal to the antenna layer AL through pads electrically connected to the antenna layer AL. The circuit board A-FPC may be electrically connected to a main board (not shown) of the electronic apparatus ED to receive a signal for driving the antenna layer AL. According to an embodiment of the inventive concept, a driving chip may be mounted on the circuit board A-FPC, but the embodiment of the inventive concept is not limited thereto.

FIGS. 2A and 2B illustrate the circuit board A-FPC in a state prior to being bent, but the circuit board A-FPC may be bent so that a portion of the circuit board A-FPC overlaps the display module DM in a plan view. Referring to FIGS. 2A and 2B which is a state before the circuit board A-FPC is bent, the circuit board A-FPC may include a first surface F-B and a second surface F-U which are parallel to a plane formed by the first direction DR1 and the second direction DR2, respectively, and the first surface F-B and the second surface F-U may be opposite to each other in the third direction DR3. In this specification, a surface on which a conductive layer ML (refer to FIG. 6A) of the circuit board A-FPC is disposed may be defined as the upper surface of the circuit board A-FPC, and the first surface F-B of the circuit board A-FPC may correspond to the upper surface of the circuit board A-FPC. The second surface F-U of the circuit board A-FPC opposite to the first surface F-B may correspond to the lower surface of the circuit board A-FPC.

Referring to FIGS. 2A and 2B, the first surface F-B of the circuit board A-FPC may include a stepped portion which has a step difference dd. The first surface F-B of the circuit board A-FPC may include a first partial surface B1 overlapping the second portion P2 of the antenna layer AL in a plan view and in contact with the second portion P2 of the antenna layer AL, and a second partial surface B2 not overlapping the antenna layer AL. The step difference dd may correspond to a separation distance between the first partial surface B1 and the second partial surface B2 in the third direction DR3.

The stepped portion may face the first side surface S1 of the antenna layer AL in the second direction DR2. According to an embodiment of the inventive concept, the stepped portion may contact the first side surface S1 of the antenna layer AL. Since the stepped portion contacts with the first side surface S1 of the antenna layer AL, stress applied to the circuit board A-FPC in a region disposed adjacent to the stepped portion may be relieved when the second portion P2 of the antenna layer AL and the circuit board A-FPC are bent. Accordingly, it is possible to prevent cracks in the circuit board A-FPC in an area disposed adjacent to the stepped portion due to the stress generated during bending, so that damage and defects in the circuit board A-FPC may be prevented.

The circuit board A-FPC may include side surfaces, and some of the side surfaces may extend substantially parallel to the first direction DR1 and the third direction DR3. One side surface S2 of the side surfaces of the circuit board A-FPC may connect the first partial surface B1 and the second partial surface B2 of the first surface F-B to each other. The one side surface S2 of the circuit board A-FPC may be defined as a second side surface S2. The second side surface S2 may correspond to the stepped portion of the circuit board A-FPC.

The second side surface S2 of the circuit board A-FPC may face the first side surface S1 of the antenna layer AL in the second direction DR2. The second side surface S2 of the circuit board A-FPC may contact the first side surface S1 of the antenna layer AL. Because of this, when the circuit board A-FPC is bent, stress applied to the circuit board A-FPC may be relieved, and cracks in the circuit board A-FPC or damage thereto may be prevented.

Each of the first side surface S1 of the antenna layer AL and the second side surface S2 of the circuit board A-FPC may have a flat surface. However, the embodiment of the inventive concept is not limited thereto, and each of the first side surface S1 of the antenna layer AL and the second side surface S2 of the circuit board A-FPC may include a plurality of grooves. This will be described in detail later.

Figure 3:
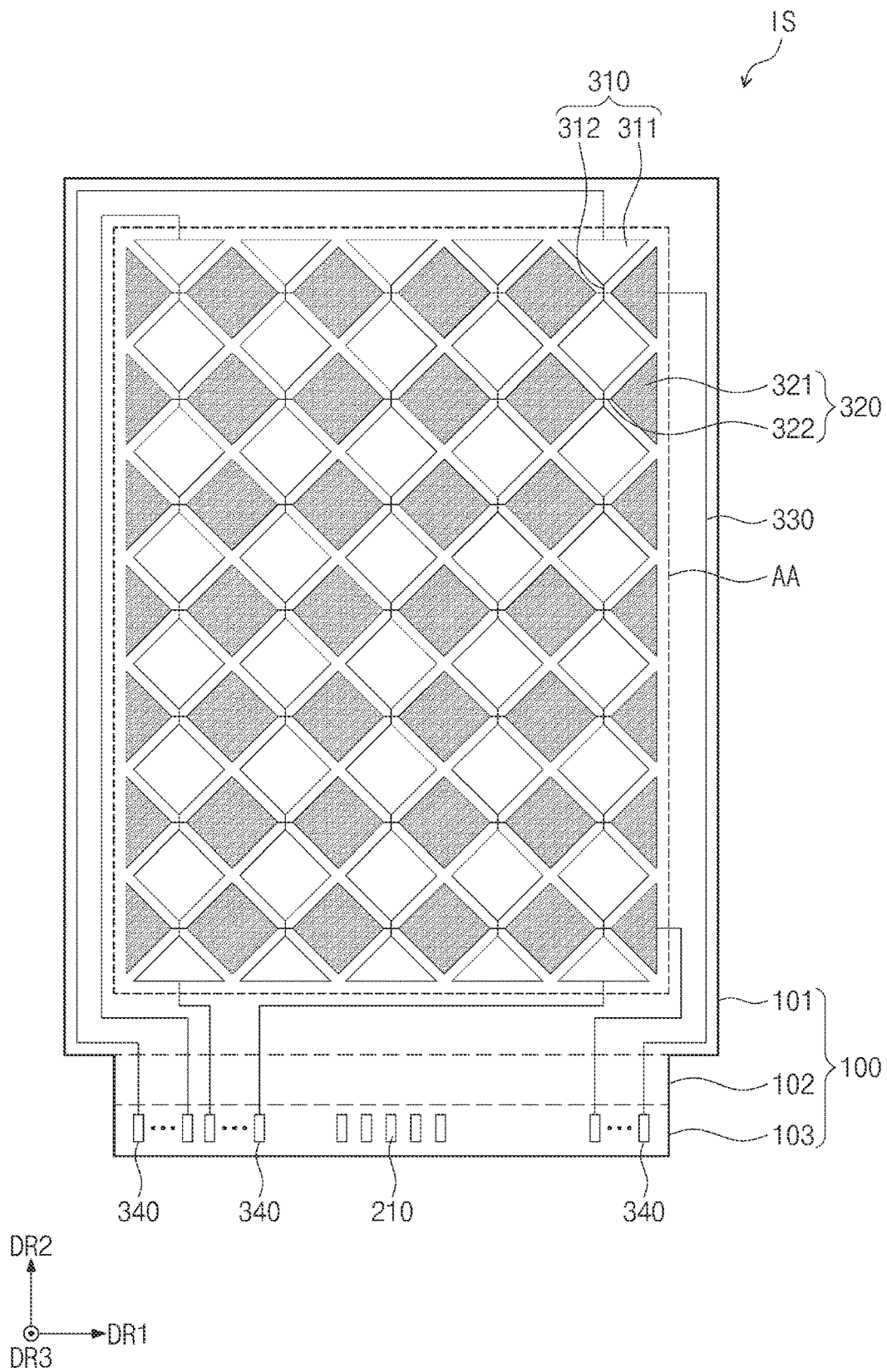
FIG. 3 is a plan view of an input sensor according to an embodiment of the inventive concept.

FIG. 3 is a plan view of an input sensor according to an embodiment of the inventive concept.

Referring to FIG. 3, the input sensor IS may be disposed on a base substrate 100. The input sensor IS may include first sensing electrodes 310, second sensing electrodes 320, sensing lines 330, and sensing pads 340.

The base substrate 100 may include a first base region 101, a second base region 102, and a third base region 103 which are arranged along the second direction DR2. The second base region 102 may extend from the first base region 101, and the third base region 103 may extend from the second base region 102.

The first base region 101 may be a region overlapping the display region AA. The second base region 102 may be a region which is bent toward the rear surface of the first base region 101 in the process of assembling the electronic apparatus ED (refer to FIG. 1). As the second base region 102 is bent, the third base region 103 may overlap a portion of the first base region 101 in a plan view. That is, the third base region 103 may be disposed on the rear surface of the first base region 101.

The input sensor IS may acquire information on an external input through a change in mutual capacitance or a change in self-capacitance. For example, the input sensor IS may acquire information on the external input through a change in mutual capacitance between the first sensing electrodes 310 and the second sensing electrodes 320.

The first sensing electrodes 310 and the second sensing electrodes 320 may be disposed to overlap the display region AA in the first base region 101. Each of the first sensing electrodes 310 may extend in the second direction DR2. The first sensing electrodes 310 may be disposed to be spaced apart from each other in the first direction DR1. Each of the second sensing electrodes 320 may extend in the first direction DR1. The second sensing electrodes 320 may be disposed to be spaced apart from each other in the second direction DR2.

Each of the first sensing electrodes 310 may include first sensing patterns 311 and bridge patterns 312 electrically connecting two adjacent first sensing patterns 311 to each other among the first sensing patterns 311.

The first sensing patterns 311 and the bridge patterns 312 may be disposed on different layers. For example, when the bridge patterns 312 are included in a first sensing conductive layer 302 (refer to FIG. 5) to be described later, the first sensing patterns 311 may be included in a second sensing conductive layer 304 (refer to FIG. 5) to be described later. Alternatively, when the bridge patterns 312 are included in the second sensing conductive layer 304 (refer to FIG. 5), the first sensing patterns 311 may be included in the first sensing conductive layer 302 (refer to FIG. 5).

Each of the second sensing electrodes 320 includes second sensing patterns 321 and connection patterns 322 connecting two adjacent second sensing patterns 321 to each other among the second sensing patterns 321.

The second sensing patterns 321 may be disposed on the same layer as the connection patterns 322. The second sensing patterns 321 and the connection patterns 322 may have an integral shape. The connection patterns 322 may respectively cross the bridge patterns 312. However, the embodiment of the inventive concept is not limited thereto, and the bridge patterns 312 may overlap the second sensing patterns 321 in a plan view according to the shapes of the bridge patterns 312.

Each of the first sensing electrodes 310 and the second sensing electrodes 320 may be electrically connected to at least one of the sensing lines 330. Each of the sensing lines 330 may be electrically connected to an end of a corresponding sensing electrode. For example, one first sensing electrode 310 may be connected to two sensing lines 330, and the two sensing lines 330 may be respectively connected to one end and the other end of the first sensing electrode 310. One second sensing electrode 320 may be connected to one sensing line 330. However, the shape, in which the sensing lines 330 are connected to the first sensing electrodes 310 and the second sensing electrodes 320, is not limited to the illustrated example and may be variously modified.

The sensing pads 340 may be disposed on the third base region 103. The sensing pads 340 may be disposed adjacent to an end of the third base region 103. The sensing pads 340 may be arranged along the first direction DR1. The sensing pads 340 may be electrically connected to the sensing lines 330, respectively. Each of the sensing lines 330 may extend from the first base region 101 toward the third base region 103 via the second base region 102 to be connected to a corresponding sensing pad 340.

Driving chip pads 210 may be disposed on the third base region 103. FIG. 3 illustrates the driving chip pads 210 arranged in one row, but the embodiment of the inventive concept is not limited thereto, and the driving chip pads 210 may be arranged in a plurality of rows along the first direction DR1 and the second direction DR2. A driving chip (not illustrated) electrically connected to the display module DM (refer to FIG. 2A) may be disposed on the driving chip pads 210.

Figure 4A:
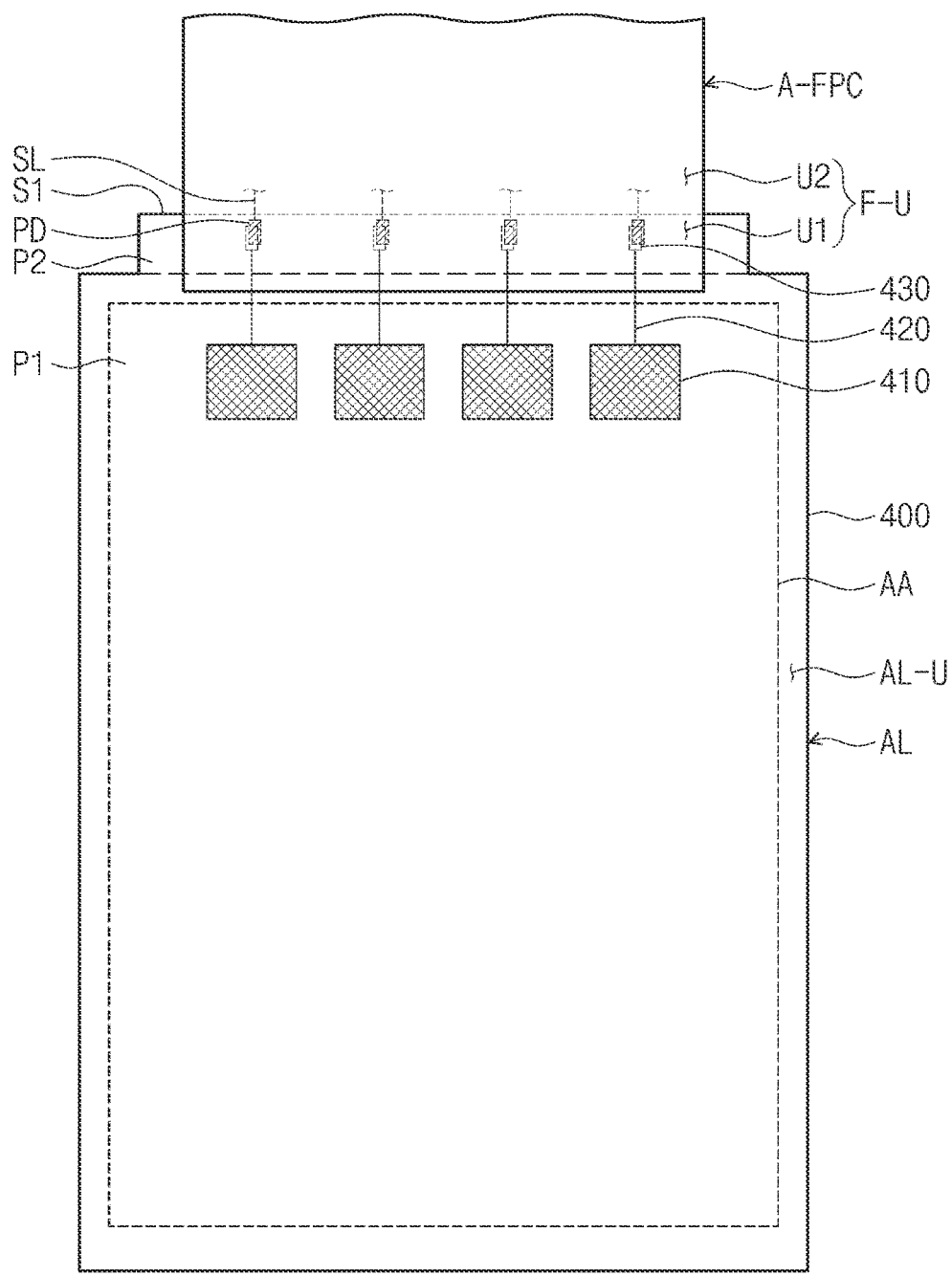
FIGS. 4A and 4B are plan views of an antenna layer according to an embodiment of the inventive concept.
Figure 4B:
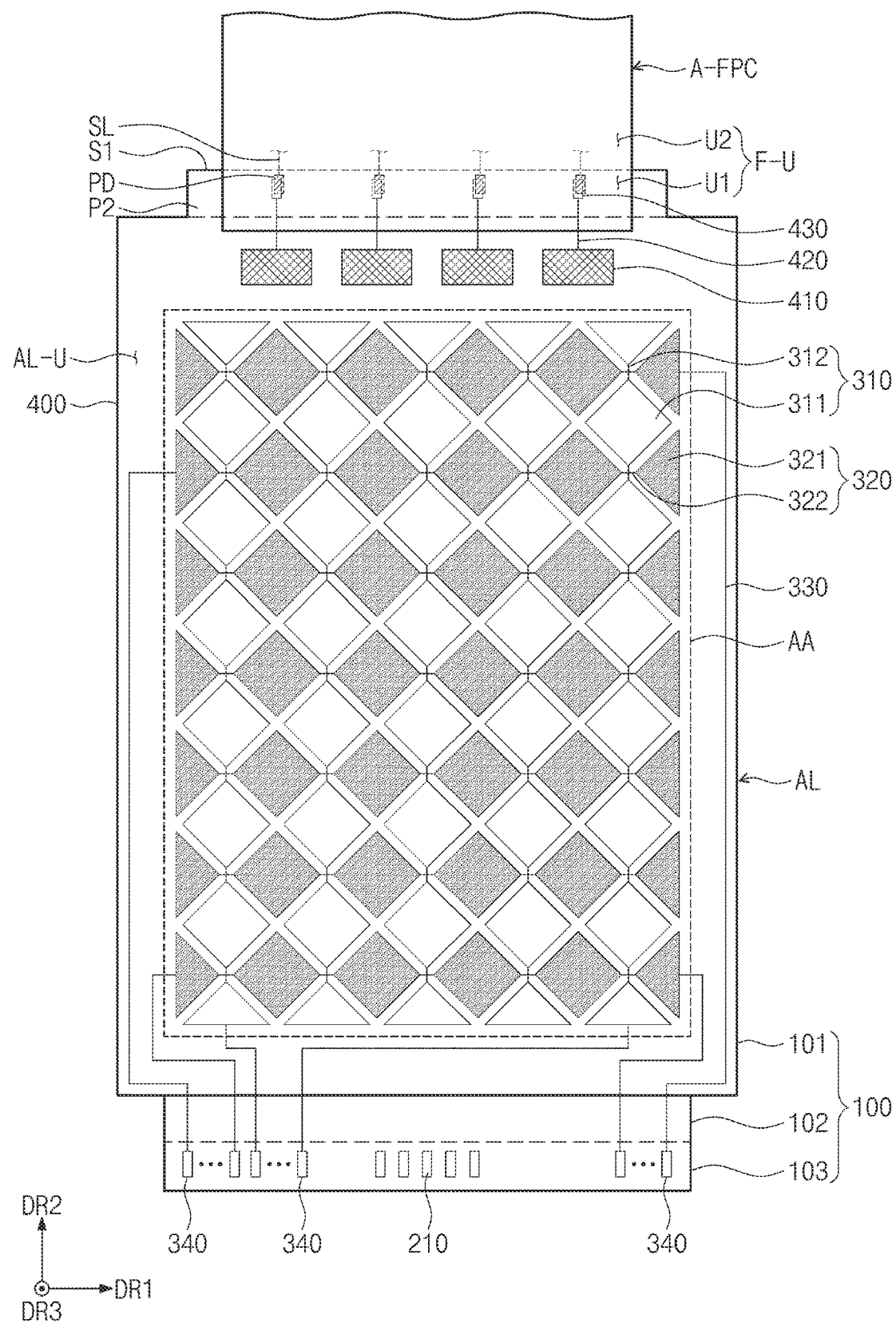

FIGS. 4A and 4B are plan views of an antenna layer according to an embodiment of the inventive concept.

Referring to FIG. 4A, the antenna layer AL may include a base film 400, a plurality of antennas 410 (hereinafter referred to as antennas), a plurality of antenna lines 420 (hereinafter referred to as antenna lines), and a plurality of antenna pads 430 (hereinafter referred to as antenna pads). The embodiment of the inventive concept is not limited thereto, and the antenna layer AL according to an embodiment of the inventive concept may further include an antenna insulating layer 402 (refer to FIG. 5) covering the antennas 410.

FIG. 4A illustrates four antennas 410 as an example. However, the number of antennas 410 included in the electronic apparatus ED (refer to FIG. 1) is not limited thereto.

The base film 400 may include an upper surface AL-U parallel to each of the first and second directions DR1 and DR2. FIG. 4A is a plan view seen from above the upper surface AL-U of the base film 400. Meanwhile, in this specification, the expression "above the upper surface (or front surface) of an element" may be defined as a state of seeing the upper surface (front surface) of the element, and the expression "under the lower surface (or rear surface) of an element" may be defined as a state of seeing the lower surface (rear surface) of the element.

The base film 400 of the antenna layer AL may include a first portion P1 and a second portion P2, which may correspond to the first portion P1 and the second portion P2 of the antenna layer AL described above. The first portion P1 may overlap the display region AA, and the second portion P2 may extend from the first portion P1 and be bent at a curvature. With respect to the first portion P1 and the second portion P2, the aforementioned description may be equally applied.

The antennas 410 may be disposed on the first portion P1. The antennas 410 may be electrically connected to the antenna lines 420, respectively. The antennas 410 and portions of the antenna lines 420 may be disposed to overlap the display region AA. Although the area of the bezel region BZA (refer to FIG. 2A) is reduced because the electronic apparatus ED (refer to FIG. 2A) is miniaturized and thinned, the display region AA may have a predetermined area, and therefore, a region in which the antennas 410 are disposed may be sufficiently secured.

The antennas 410 may be disposed on the input sensor IS (refer to FIG. 3) and overlap some of the sensing electrodes 310 and 320 (refer to FIG. 3) of the input sensor IS (refer to FIG. 3). The antennas 410 may have a mesh pattern shape in which openings which expose light emitting elements are defined. Since the antennas 410 have a mesh pattern shape, the efficiency of light emitted through the display region AA may not be reduced. Meanwhile, FIG. 4A schematically illustrates the shapes of the antennas 410, but the embodiment of the inventive concept is not limited thereto, and the shapes of the antennas 410 may be variously modified.

The antennas 410 may operate in a predetermined frequency band. The frequency band may include a resonance frequency. The resonance frequency according to an embodiment of the inventive concept may be changed according to a frequency band of a signal to be communicated.

The antenna pads 430 may be disposed on the second portion P2. However, the embodiment of the inventive concept is not limited thereto, and the antenna pads 430 may be spaced apart from the display region AA and disposed on the first portion P1. The region in which the antenna pads 430 are disposed may vary depending on the design of the antenna layer AL. The antenna pads 430 may be arranged along the first direction DR1. The antenna pads 430 may be electrically connected to the antenna lines 420, respectively. One end of each of the antenna lines 420 may be connected to a corresponding antenna 410 and the other end thereof may be connected to a corresponding antenna pad 430.

The antennas 410, the antenna lines 420, and the antenna pads 430 may contain a conductive material. The antennas 410, the antenna lines 420, and the antenna pads 430 may be included in an antenna conductive layer 401 (refer to FIG. 5) to be described later. The antennas 410, the antenna lines 420, and the antenna pads 430 may contain a same material and may be integrally formed. However, the embodiment of the inventive concept is not limited thereto.

Meanwhile, although not illustrated separately, the antenna layer AL may further include a dummy pattern (not illustrated) which is electrically insulated from the antennas 410 and disposed on the first portion P1. The dummy pattern may surround the antennas 410 on the upper surface AL-U of the base film 400. The dummy pattern may reduce a difference in reflectance between a portion in which the antennas 410 are disposed and a portion in which the antennas 410 are not disposed. Accordingly, it is possible to prevent the antennas 410 from being visually recognized from the outside of the electronic apparatus ED (refer to FIG. 1).

The circuit board A-FPC prior to being bent may include a second surface F-U parallel to each of the first direction DR1 and the second direction DR2. FIG. 4A is a schematic plan view of the circuit board A-FPC viewed from above the second surface F-U. The second surface F-U of the circuit board A-FPC may include a first region U1 overlapping the antenna layer AL and a second region U2 extending from the first region U1 and not overlapping the antenna layer AL. The first region U1 of the second surface F-U of the circuit board A-FPC may overlap the second portion P2 of the antenna layer AL. In an embodiment of the inventive concept, the first region U1 of the second surface F-U of the circuit board A-FPC may overlap a portion of the first portion P1 of the antenna layer AL. The first region U1 of the circuit board A-FPC may be spaced apart from the display region AA in a plan view.

The circuit board A-FPC may include connection pads PD disposed in the first region U1 and connection lines SL respectively connected to the connection pads PD. The connection pads PD may be arranged in the first direction DR1. The connection pads PD may be electrically connected to the antenna pads 430, respectively. The connection pads PD may contact the antenna pads 430 or may be electrically connected thereto through a conductive adhesive.

Each of the connection lines SL may be electrically connected to a corresponding connection pad PD. The connection lines SL may transmit a driving signal, which is provided from the main board, to the connection pads PD and the antenna pads 430, and the antennas 410 may be driven in response to the driving signal.

According to the embodiment of the inventive concept illustrated in FIG. 4B, the antennas 410 may be disposed on the same layer as at least some of the first sensing electrodes 310 and the second sensing electrodes 320. The antennas 410 may be disposed to be spaced apart from the display region AA in which the first sensing electrodes 310 and the second sensing electrodes 320 are disposed. The sensing electrode disposed on the same layer as the antennas 410 among the first sensing electrodes 310 and the second sensing electrodes 320 may be disposed on the base film 400. That is, the input sensor IS and the antenna layer AL may be formed on the same base layer on a same plane, and the inventive concept is not limited to any one embodiment.

Figure 5:
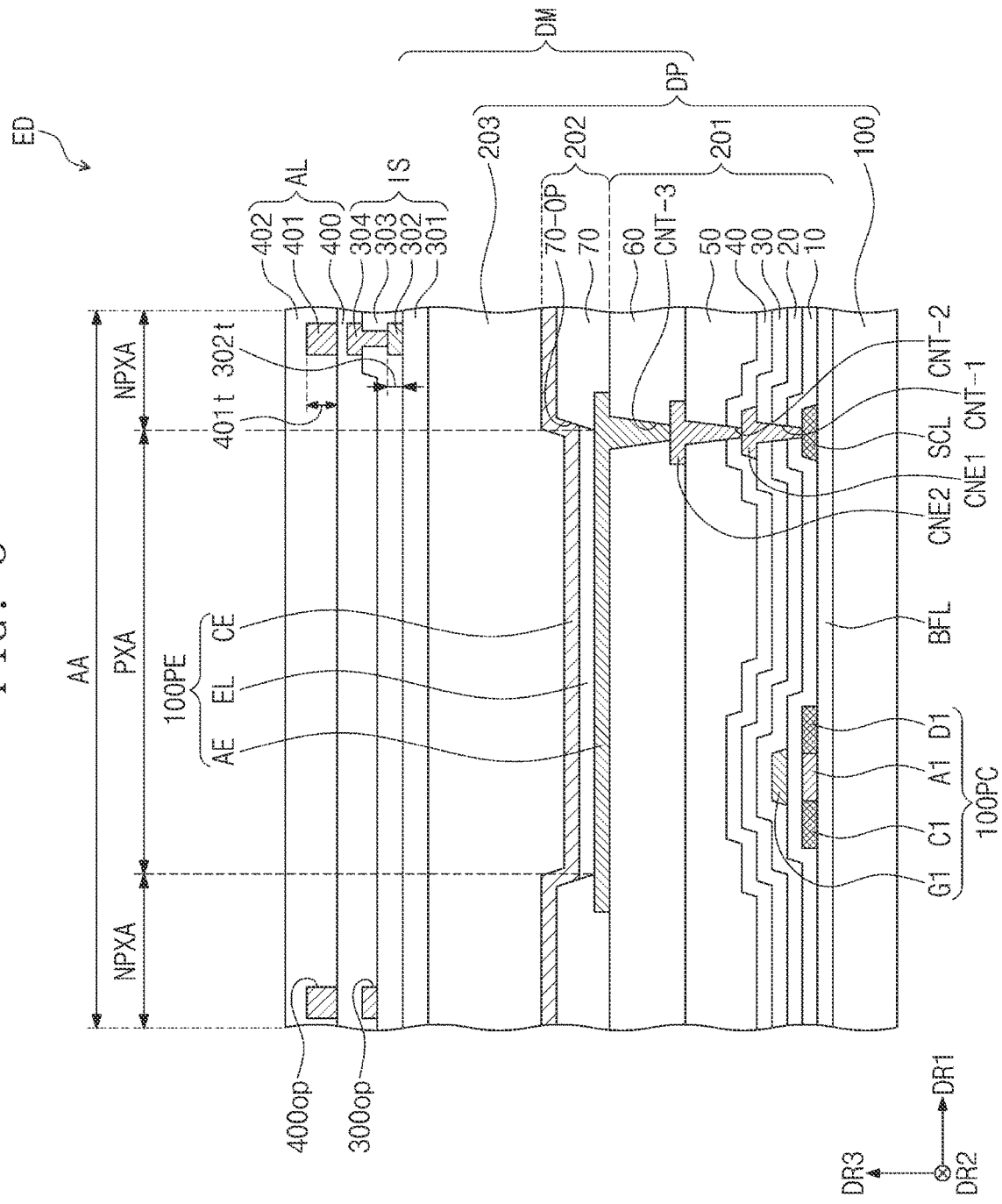
FIG. 5 is a cross-sectional view of the electronic apparatus according to an embodiment of the inventive concept.

FIG. 5 is a cross-sectional view of the electronic apparatus according to an embodiment of the inventive concept.

Referring to FIG. 5, the display panel DP may include a base substrate 100, a circuit layer 201, a light-emitting element layer 202, and an encapsulation layer 203. The display panel DP may include a plurality of insulating layers, a semiconductor pattern, and a conductive pattern. After an insulating layer, a semiconductor layer, and a conductive layer are formed on the base substrate 100 through a coating process, a deposition process, or the like, the insulating layer, the semiconductor layer, and the conductive layer may be selectively patterned through a photolithography process to form the semiconductor pattern and the conductive pattern included in the circuit layer 201 or the light-emitting element layer 202.

Each of pixels of the display panel DP may have an equivalent circuit including a plurality of transistors, a capacitor, and a light-emitting element, and the equivalent circuit of a pixel may be modified in various forms. The circuit layer 201 may include a semiconductor pattern and a conductive pattern arranged in a predetermined rule over the pixels. The semiconductor pattern and the conductive pattern of the circuit layer 201 may constitute a plurality of transistors, electrodes, signal lines, pads, and the like. FIG. 5 exemplarily illustrates a cross section corresponding to one transistor 100PC and a light-emitting element 100PE. However, the embodiment of the inventive concept is not limited thereto, and the cross sections of the circuit layer 201 and the light-emitting element layer 202 may be variously modified according to a manufacturing process or an equivalent circuit configuration of a pixel.

The base substrate 100 may provide a base surface on which the circuit layer 201 is disposed. The base substrate 100 may include a glass substrate, a polymer substrate, an organic/inorganic composite material substrate, or the like. The base substrate 100 may have a single-layered or multi-layered structure. For example, the base substrate 100 having a multi-layered structure may include synthetic resin layers and at least one inorganic layer disposed between the synthetic resin layers, or may include a glass substrate and a synthetic resin layer disposed on the glass substrate.

The synthetic resin layer of the base substrate 100 may include at least one of an acryl-based resin, a methacryl-based resin, polyisoprene, a vinyl-based resin, an epoxy-based resin, a urethane-based resin, a cellulose-based resin, a siloxane-based resin, a polyamide-based resin, a perylene-based resin, or a polyimide-based resin. However, the material of the base substrate 100 is not limited to the above examples.

Referring to FIG. 5, the circuit layer 201 may include a transistor 100PC, a connection signal line SCL, connection electrodes CNE1 and CNE2, and a plurality of insulating layers 10, 20, 30, 40, 50, and 60.

The circuit layer 201 may further include a buffer layer BFL disposed on the base substrate 100. The buffer layer BFL may improve the bonding strength between the base substrate 100 and the semiconductor pattern. The buffer layer BFL may include an inorganic material. For example, the buffer layer BFL may contain at least one of aluminum oxide, titanium oxide, silicon oxide, silicon nitride, silicon oxynitride, zirconium oxide, or hafnium oxide. In an embodiment of the inventive concept, the buffer layer BFL may include a silicon oxide layer and a silicon nitride layer that are alternately stacked. However, the embodiment of the buffer layer BFL is not limited to the above examples.

The semiconductor pattern of the transistor 100PC may be disposed on the buffer layer BFL. The semiconductor pattern may contain polysilicon. However, the embodiment of the inventive concept is not limited thereto, and the semiconductor pattern may contain amorphous silicon, crystalline oxide, or noncrystalline oxide.

A source region C1, a drain region D1, and a channel region A1 of the transistor 100PC may be formed from the semiconductor pattern. The semiconductor pattern may include a plurality of regions according to conductivity. For example, the electrical properties of the semiconductor pattern may vary depending on whether the semiconductor pattern is doped or not, or whether metal oxide is reduced or not. A region having high conductivity in the semiconductor pattern may serve as an electrode or a signal line, which may correspond to the source region C1 and the drain region D1 of the transistor 100PC. A non-doped or non-reduced region having relatively low conductivity may correspond to the channel region A1 (or active region) of the transistor 100PC.

The connection signal line SCL may be disposed on the buffer layer BFL. The connection signal line SCL may be formed from the semiconductor pattern and disposed on the same layer as the source region C1, the active region A1, and the drain region D1 of the transistor 100PC. The connection signal line SCL may be electrically connected to the drain region D1 of the transistor 100PC in a plan view.

The plurality of insulating layers 10, 20, 30, 40, 50, and 60 may be disposed above the buffer layer BFL. Each of the plurality of insulating layers 10, 20, 30, 40, 50, and 60 may include at least one inorganic layer or organic layer. For example, the inorganic layer may contain at least one of aluminum oxide, titanium oxide, silicon oxide, silicon nitride, silicon oxynitride, zirconium oxide, or hafnium oxide, but the embodiment of the inventive concept is not limited to the above materials. The organic layer may contain a phenol-based polymer, an acryl-based polymer, an imide-based polymer, an aryl ether-based polymer, an amide-based polymer, a fluorine-based polymer, a p-xylene-based polymer, a vinyl alcohol-based polymer, and a combination thereof, but the embodiment of the inventive concept is not limited to the above materials.

A first insulating layer 10 may be disposed on the buffer layer BFL. The first insulating layer 10 may be disposed in common in pixels and cover the semiconductor pattern. A gate G1 of the transistor 100PC may be disposed on the first insulating layer 10. The gate G1 may be a portion of the conductive pattern. The gate G1 may overlap the channel region A1. The gate G1 may function as a mask in the process of doping the semiconductor pattern.

A second insulating layer 20 may cover the gate G1 and be disposed on the first insulating layer 10. A third insulating layer 30 may be disposed on the second insulating layer 20.

The connection electrodes CNE1 and CNE2 may include a first connection electrode CNE1 and a second connection electrode CNE2 which are disposed above the connection signal line SCL. The first connection electrode CNE1 may be disposed on the third insulating layer 30. The first connection electrode CNE1 may be connected to the connection signal line SCL through a contact hole CNT-1 formed through the first to third insulating layers 10, 20, and 30.

A fourth insulating layer 40 may be disposed on the third insulating layer 30 and the first connection electrode CNE1. A fifth insulating layer 50 may be disposed on the fourth insulating layer 40. In an embodiment of the inventive concept, the fifth insulating layer 50 may include an organic layer. The fifth insulating layer 50 may provide a flat upper surface to the elements disposed thereon. However, the embodiment of the inventive concept is not necessarily limited thereto.

The second connection electrode CNE2 may be disposed on the fifth insulating layer 50. The second connection electrode CNE2 may be connected to the first connection electrode CNE1 through a contact hole CNT-2 formed through the fourth insulating layer 40 and the fifth insulating layer 50.

A sixth insulating layer 60 may be disposed on the fifth insulating layer 50. In an embodiment of the inventive concept, the sixth insulating layer 60 may include an organic layer and provide a flat upper surface to the elements disposed on the sixth insulating layer 60. However, the embodiment of the inventive concept is not necessarily limited thereto.

The light-emitting element layer 202 may be disposed on the circuit layer 201. The light-emitting element layer 202 may include a pixel defining film 70 and a light-emitting element 100PE. The light-emitting element 100PE may include a first electrode AE, a light-emitting layer EL, and a second electrode CE.

For example, the light-emitting element 100PE may include an organic light-emitting element, an inorganic light-emitting element, a quantum dot light-emitting element, a micro LED light-emitting element, or a nano LED light-emitting element. The embodiment of the inventive concept is not limited thereto, and the light-emitting element 100PE may include various embodiments as long as light can be generated or the amount of light can be controlled according to an electrical signal.

Referring to FIG. 5, the first electrode AE may be disposed on the circuit layer 201. In an embodiment of the inventive concept, the first electrode AE may be disposed on the sixth insulating layer 60. The pixel defining film 70 may be disposed on the sixth insulating layer 60 and cover a portion of the first electrode AE. A light-emitting opening 70-OP exposing a portion of the first electrode AE may be defined in the pixel defining film 70.

The pixel defining film 70 may contain a polymer resin. For example, the pixel defining film 70 may contain a polyacrylate-based resin or a polyimide-based resin. The pixel defining film 70 may be formed to further contain an inorganic material in addition to the polymer resin. The pixel defining film 70 may be formed of an inorganic material. For example, the pixel defining film 70 may contain silicon nitride ($SiN_x$), silicon oxide ($SiO_x$), silicon oxynitride ($SiO_xN_y$), and the like.

In an embodiment of the inventive concept, the pixel defining film 70 may contain a light absorbing material. The pixel defining film 70 may contain a black coloring agent. The black coloring agent may include a black dye and a black pigment. The black coloring agent may contain carbon black, or a metal such as chromium, or an oxide thereof. However, the embodiment of the pixel defining film 70 is not limited to the above examples.

The display region AA of the display module DM may include a light-emitting region PXA and a non-light-emitting region NPXA. The light-emitting region PXA may be a region from which light is emitted and may be surrounded by the non-light-emitting region NPXA. A portion of the first electrode AE exposed through the light-emitting opening 70-OP may correspond to the light-emitting region PXA. The light-emitting region PXA may be provided in plurality, and the non-light-emitting region NPXA may surround the plurality of light-emitting regions PXA.

The light-emitting layer EL may be disposed on the first electrode AE. The light-emitting layer EL may be disposed in a region corresponding to the light-emitting opening 70-OP. That is, the light-emitting layer EL may be an isolated light-emitting pattern which corresponds to each of the pixels. In this case, each of the light-emitting layers EL of the pixels may emit light of at least one color among blue, red, and green. However, the embodiment of the inventive concept is not limited thereto, and the light-emitting layer EL may be commonly disposed in the pixels. In this case, the light-emitting layer EL may provide blue light or white light.

The second electrode CE may be disposed on the light-emitting layer EL. The second electrode CE may have an integral shape and be commonly disposed in the pixels. The second electrode CE may overlap the light-emitting region PXA and the non-light-emitting region NPXA. A common voltage may be provided to the second electrode CE.

Meanwhile, the light-emitting element 100PE may further include at least one light-emitting functional layer disposed between the first electrode AE and the second electrode CE. The light-emitting functional layer may include an electron injection layer, an electron transport layer, a hole blocking layer, a hole injection layer, a hole transport layer, an electron blocking layer, a charge generating layer, and the like. As an example, the light-emitting element 100PE may include the hole transport layer disposed between the first electrode AE and the light-emitting layer EL and the electron transport layer disposed between the second electrode CE and the light-emitting layer EL. The light-emitting functional layer may be commonly formed in the pixels by using an open mask, but the embodiment of the inventive concept is not limited thereto.

The light-emitting layer EL may contain an organic light-emitting material or an inorganic light-emitting material so as to emit light. Through the transistor 100PC, a first voltage may be applied to the first electrode AE and a common voltage may be applied to the second electrode CE. Holes and electrons injected into the light-emitting layer EL may be combined to form excitons, and while the excitons transition to a ground state, the light-emitting element 100PE may emit light.

The encapsulation layer 203 may be disposed on the light-emitting element layer 202. The encapsulation layer 203 may include at least one insulating film. The insulating film may include an inorganic layer or an organic layer. In an embodiment of the inventive concept, the encapsulation layer 203 may include a plurality of insulating films, and the plurality of insulating films may be a first inorganic layer, an organic layer, and a second inorganic layer which are sequentially stacked. However, the layers constituting the encapsulation layer 203 are not limited thereto.

The inorganic layer of the encapsulation layer 203 may protect the light-emitting element layer 202 from moisture and oxygen, and the organic layer of the encapsulation layer 203 may protect the light-emitting element layer 202 from foreign substances such as dust particles. For example, the inorganic layer may include a silicon nitride layer, a silicon oxynitride layer, a silicon oxide layer, a titanium oxide layer, an aluminum oxide layer, or the like, but the embodiment of the inventive concept is not limited thereto. The organic layer may include an acryl-based organic layer, but the embodiment of the inventive concept is not limited thereto.

The input sensor IS may be disposed on the display panel DP. The input sensor IS may include a base insulating layer 301, a first sensing conductive layer 302, a sensing insulating layer 303, and a second sensing conductive layer 304. In an embodiment of the inventive concept, the base insulating layer 301 of the input sensor IS may be omitted.

The input sensor IS may be directly disposed on the display panel DP. The input sensor IS may be formed directly on the uppermost layer of the encapsulation layer 203 of the display panel DP. For example, the base insulating layer 301 may be formed on a base surface provided by the encapsulation layer 203 so as to directly contact with the encapsulation layer 203. However, the embodiment of the inventive concept is not limited thereto, and when the base insulating layer 301 is omitted, the first sensing conductive layer 302 may be directly formed on the base surface provided by the encapsulation layer 203.

The base insulating layer 301 may include an inorganic layer or an organic layer. For example, the base insulating layer 301 may contain any one of silicon nitride, silicon oxynitride, and silicon oxide, or may contain an epoxy resin, an acrylic resin, or an imide-based resin. The base insulating layer 301 may have a single-layered structure or a multi-layered structure.

The first sensing conductive layer 302 may be disposed on the base insulating layer 301. The sensing insulating layer 303 may cover the first sensing conductive layer 302 and be disposed on the base insulating layer 301. The second sensing conductive layer 304 may be disposed on the sensing insulating layer 303.

The sensing insulating layer 303 may include an inorganic film or an organic film. The inorganic film of the sensing insulating layer 303 may contain at least one of aluminum oxide, titanium oxide, silicon oxide, silicon oxynitride, zirconium oxide, or hafnium oxide. The organic film of the sensing insulating layer 303 may contain an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin. However, the material of the sensing insulating layer 303 is not limited to the above examples.

Each of the first sensing conductive layer 302 and the second sensing conductive layer 304 may contain a conductive material. Each of the first sensing conductive layer 302 and the second sensing conductive layer 304 may have a single-layered structure or a multi-layered structure stacked along the third direction DR3.

A single-layered conductive layer may include a metal layer or a transparent conductive layer. The metal layer may contain molybdenum, silver, titanium, copper, aluminum, or an alloy thereof. The transparent conductive layer may contain transparent conductive oxide such as indium tin oxide (ITO), indium zinc oxide (IZO), zinc oxide (ZnO), or indium zinc tin oxide (IZTO). In addition thereto, the transparent conductive layer may contain a conductive polymer such as PEDOT, metal nanowire, graphene, and the like.

A multi-layered conductive layer may include sequentially stacked metal layers. The metal layers may have, for example, a three-layer structure of titanium/aluminum/titanium. The multi-layered conductive layer may include at least one metal layer and at least one transparent conductive layer.

The first sensing conductive layer 302 and the second sensing conductive layer 304 may be disposed in the non-light-emitting region NPXA. In a plan view, the first sensing conductive layer 302 and the second sensing conductive layer 304 may be provided in a mesh pattern having an opening 300op corresponding to the light-emitting region PXA. Accordingly, the first sensing conductive layer 302 and the second sensing conductive layer 304 may not obstruct the path of light output from the light-emitting element 100PE, and the input sensor IS may not deteriorate the light output efficiency of the light-emitting element 100PE.

The first sensing conductive layer 302 and the second sensing conductive layer 304 may include the aforementioned sensing electrodes 310 and 320 (refer to FIG. 3). That is, each of the sensing electrodes 310 and 320 (refer to FIG. 3) may be composed of patterns included in the first sensing conductive layer 302 and/or the second sensing conductive layer 304.

The antenna layer AL may be disposed on the display module DM. The antenna layer AL may include a base film 400 and an antenna conductive layer 401. The embodiment of the inventive concept is not limited thereto, and the antenna layer AL may further include an antenna insulating layer 402 disposed on the antenna conductive layer 401.

The antenna layer AL may be directly disposed on the input sensor IS. For example, the base film 400 of the antenna layer AL may directly contact and cover the second sensing conductive layer 304 of the input sensor IS. However, the embodiment of the inventive concept is not limited thereto, and the antenna layer AL may be attached on the input sensor IS by a separate adhesive member.

The base film 400 may contain a material having a permittivity. The base film 400 may contain a material having light transmittance. For example, the base film 400 may contain at least any one of an acryl-based resin, a methacryl-based resin, polyisoprene, a vinyl-based resin, an epoxy-based resin, a urethane-based resin, a cellulose-based resin, a siloxane-based resin, a polyamide-based resin, or a perylene-based resin.

The antenna conductive layer 401 may be disposed on the base film 400. The antenna conductive layer 401 may include a metal layer or a transparent conductive layer. The metal layer may contain molybdenum, silver, titanium, copper, aluminum, or an alloy thereof. The transparent conductive layer may contain transparent conductive oxide such as indium tin oxide (ITO), indium zinc oxide (IZO), zinc oxide (ZnO), or indium zinc tin oxide (IZTO). In addition thereto, the transparent conductive layer may contain a conductive polymer such as PEDOT, metal nanowire, graphene, and the like.

The antenna conductive layer 401 may have a single-layered structure or a multi-layered structure stacked along the third direction DR3. The multi-layered conductive layer may include sequentially stacked metal layers. The metal layers may have, for example, a three-layer structure of titanium/aluminum/titanium. The multi-layered conductive layer may include at least one metal layer and at least one transparent conductive layer.

The antenna conductive layer 401 may include antennas 410 (refer to FIG. 4A). That is, the antennas 410 (refer to FIG. 4A) may be composed of patterns included in the antenna conductive layer 401. The antenna conductive layer 401 may be disposed in the non-light-emitting region NPXA. In a plan view, the antenna conductive layer 401 may be provided in a mesh pattern having an opening 400op corresponding to the light-emitting region PXA. Accordingly, the antenna conductive layer 401 may not reduce the light output efficiency of the light-emitting element 100PE. However, the shapes of the patterns included in the antenna conductive layer 401 are not limited thereto and may be designed in various ways.

A thickness 401t of the antenna conductive layer 401 may be greater than the thickness of each of the first sensing conductive layer 302 and the second sensing conductive layer 304. For example, the thickness 401t of the antenna conductive layer 401 may be about 1.3 times to about 2 times a thickness 302t of the first sensing conductive layer 302. For example, the thickness 302t of the first sensing conductive layer 302 may be about 2500 angstroms to about 3000 angstroms, and the thickness 401t of the antenna conductive layer 401 may be about 4000 angstroms to about 6000 angstroms. Accordingly, the resistance of the antenna conductive layer 401 may be smaller than the resistance of the first sensing conductive layer 302 under the condition that the planar areas thereof are equal to each other.

The antenna insulating layer 402 may cover the antenna conductive layer 401 and provide a flat upper surface. The antenna insulating layer 402 may protect the antenna conductive layer 401. The antenna insulating layer 402 may include an organic film. For example, the organic film of the antenna insulating layer 402 may contain at least any one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

Figure 6A:
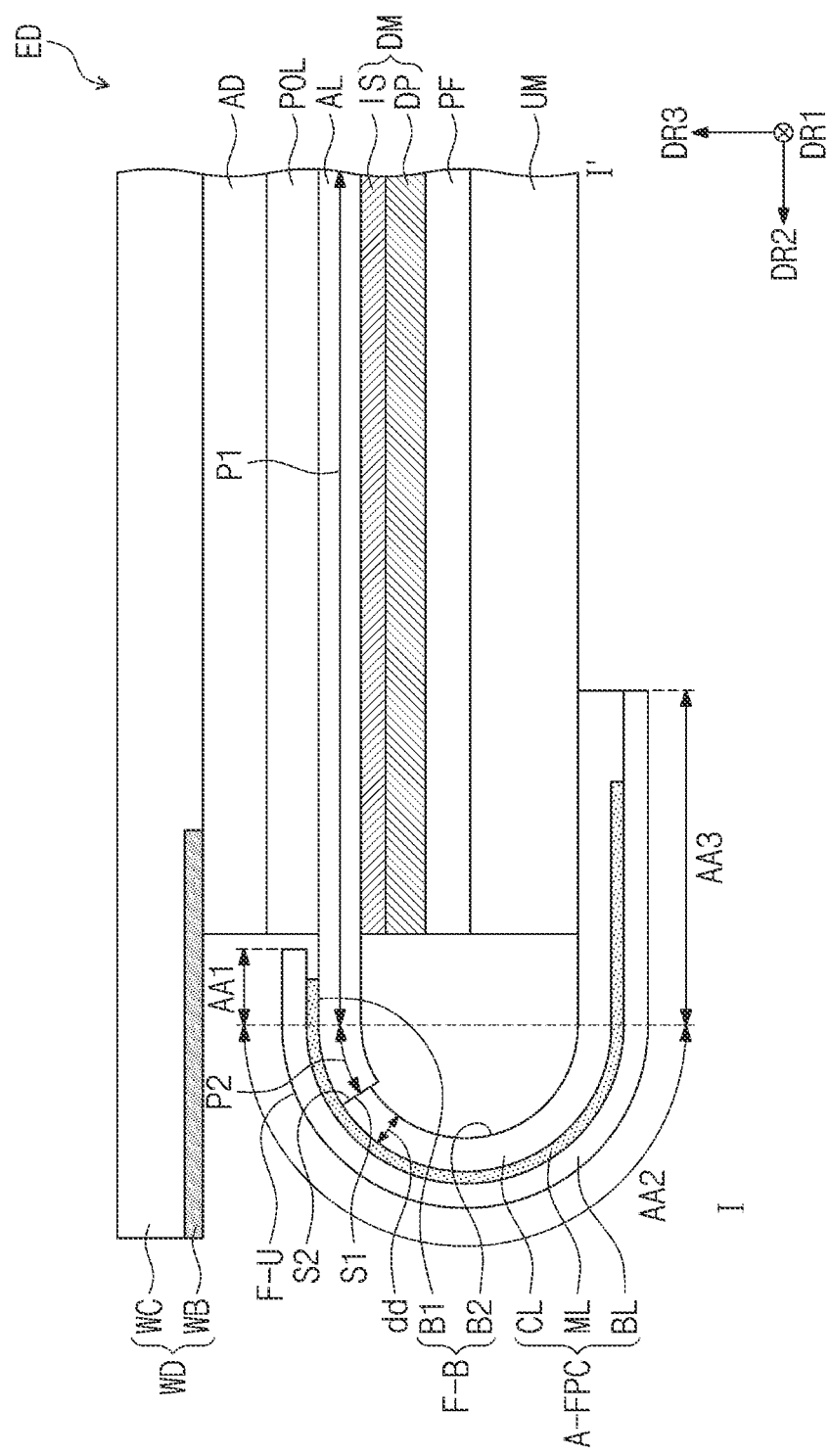
FIG. 6A is a cross-sectional view of an electronic apparatus according to an embodiment of the inventive concept corresponding to line I-I' in FIG. 2A.
Figure 6B:
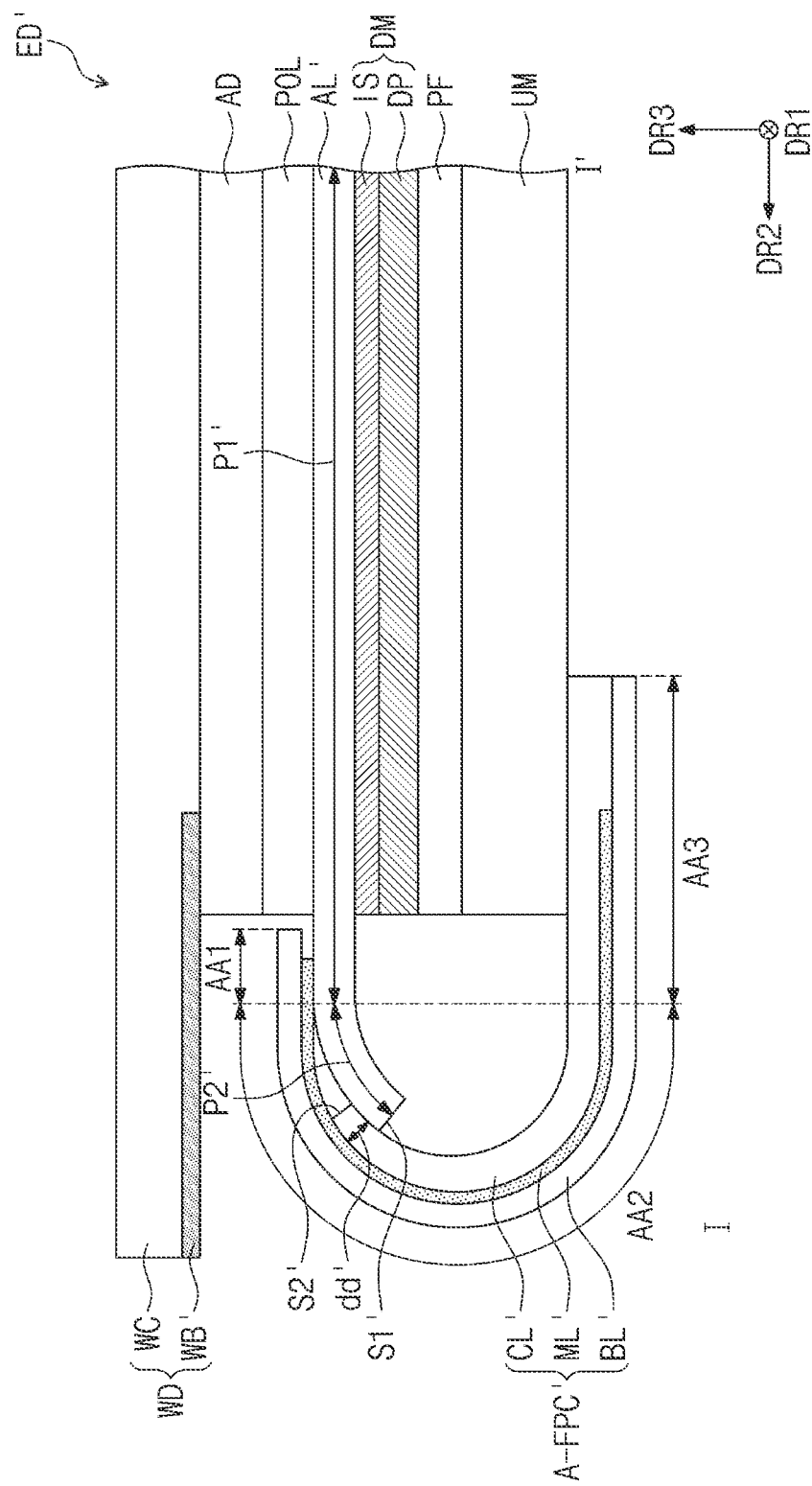
FIG. 6B is a cross-sectional view of an electronic apparatus according to a comparative embodiment of the inventive concept.

FIG. 6A is a cross-sectional view of an electronic apparatus according to an embodiment of the inventive concept corresponding to line I-I' in FIG. 2A. FIG. 6B is a cross-sectional view of an electronic apparatus according to a comparative embodiment of the inventive concept. FIG. 6A illustrates a cross section of the electronic apparatus ED viewed from the first direction DR1 parallel to a bending axis of a circuit board A-FPC and illustrates a cross section of the circuit board A-FPC in a bent state.

Referring to FIG. 6A, the electronic apparatus ED according to an embodiment of the inventive concept may include a window WD, a polarization layer POL, an antenna layer AL, a circuit board A-FPC, a display module DM, a lower protection film PF, and a lower module UM. The electronic apparatus ED may include an adhesive layer AD disposed between the window WD and the polarization layer POL. However, the embodiment of the inventive concept is not limited thereto, and the adhesive layer AD may be omitted. The aforementioned description may be equally applied to each element illustrated in FIG. 6A.

The adhesive layer AD may contain a transparent adhesive such as an optically clear adhesive (OCA) film, an optically clear adhesive resin (OCR), or a pressure sensitive adhesive (PSA) film. The embodiment of the inventive concept is not limited thereto, and the adhesive layers AD may contain a conventional adhesive.

The window WD may include a window substrate WC and a bezel pattern WB. The window substrate WC may contain an optically transparent material. For example, the window substrate WC may include at least one of a glass substrate or a synthetic resin film. The window substrate WC may have a single-layered or multi-layered structure.

The bezel pattern WB may be a color layer formed on one surface of the window substrate WC. The bezel pattern WB may have a single-layered or multi-layered structure. The bezel pattern WB having a multi-layered structure may include a chromatic color layer and an achromatic (particularly, black) light blocking layer. The bezel pattern WB may be formed through a deposition, printing, or coating process. The region in which the bezel pattern WB is disposed may correspond to the aforementioned bezel region BZA (refer to FIG. 2A) of the window WD. The elements of the electronic apparatus ED disposed to overlap the bezel pattern WB may not be visually recognized from the outside because light is blocked by the bezel pattern WB.

The polarization layer POL may be disposed between the antenna layer AL and the window WD. The polarization layer POL may reduce the reflectance of external light incident toward the display module DM from above the electronic apparatus ED.

The polarization layer POL according to an embodiment of the inventive concept may include a retarder and a polarizer. The retarder may include a λ/2 retarder and/or a λ/4 retarder. Each of the retarder and the polarizer may be a film type or a liquid crystal coating type. The film-type polarizer may include a stretchable synthetic resin film, and the liquid crystal coating-type polarizer may include liquid crystals arranged in a predetermined arrangement. The embodiment of the inventive concept is not limited thereto, and the retarder and the polarizer may be implemented as a single polarizing film. The polarization layer POL may further include a protective film disposed above or below the polarizing film.

The polarization layer POL according to an embodiment may include a destructive interference structure. For example, the destructive interference structure may include a first reflective layer and a second reflective layer which are disposed on different layers. First reflected light reflected from the first reflective layer and second reflected light reflected from the second reflective layer may destructively interfere with each other, and accordingly, the polarization layer POL may reduce the reflectance of external light.

The polarization layer POL according to an embodiment of the inventive concept may include color filters. The color filters may be disposed to correspond to the arrangement and light-emitting colors of the pixels included in the display panel DP. The color filters may filter external light incident toward the display module DM into the same colors as those emitted by the pixels. The polarization layer POL may further include a black matrix disposed adjacent to the color filters.

The lower protective film PF may be disposed below the display module DM to protect the rear surface of the display module DM. The lower protective film PF may contain a flexible polymer material. For example, the lower protective film PF may include at least one of polyethylene terephthalate or polyimide. However, the material of the lower protective film PF is not limited to the above examples.

The lower module UM may be disposed below the display module DM. According to an embodiment of the inventive concept, the lower module UM may be disposed below the lower protective film PF. The lower module UM may be disposed below the display module DM to protect the display module DM from external impacts or interference. The lower module UM may include at least one functional layer. For example, the lower module UM may include at least one of an impact absorbing layer, a light blocking layer, or a heat dissipation layer.

The impact absorbing layer may include a foam. The impact absorbing layer may be provided as a synthetic resin layer including a plurality of pores. For example, the synthetic resin layer may contain at least any one of acrylonitrile butadiene styrene copolymer (ABS), polyurethane (PU), polyethylene (PE), ethylene vinyl acetate (EVA), or polyvinyl chloride (PVC), but the embodiment of the inventive concept is not limited thereto. As the impact absorbing layer has a porous structure, it is possible to absorb an impact applied to the display module DM.

The light blocking layer may block light emitted to the rear surface of the display panel DP. Accordingly, the light blocking layer may solve the problem that the elements disposed on the rear surface of the display module DM are visible to the outside.

The heat dissipation layer may effectively dissipate heat generated in the display module DM. The heat dissipation layer may include at least any one of graphite, copper (Cu), or aluminum (Al) having good heat dissipation properties, but the embodiment of the inventive concept is not limited to the above examples. The heat dissipation layer may have electromagnetic wave shielding or electromagnetic wave absorption properties as well as improve heat dissipation properties.

Referring to FIG. 6A, the second portion P2 of the antenna layer AL may be bent at a curvature with respect to a bending axis extending along the first direction DR1. The circuit board A-FPC is coupled to the second portion P2 of the antenna layer AL and may be bent at a curvature with respect to the bending axis extending along the first direction DR1. The aforementioned first side surface S1 of the antenna layer AL may correspond to an end of the bent second portion P2.

The circuit board A-FPC may include a base layer BL, a conductive layer ML, and a cover layer CL which are sequentially stacked. The base layer BL may contain a soft material. In an embodiment of the inventive concept, the base layer BL may be provided in the form of a flexible film. The base layer BL may contain a polymer resin. For example, the base layer BL may include a polyimide resin, an epoxy resin, or a polyester resin. However, the material of the base layer BL is not limited to the above examples.

The conductive layer ML may be disposed on the base layer BL. The conductive layer ML may contain a conductive material. The conductive layer ML may include the connection pads PD (refer to FIG. 4A) of the circuit board A-FPC disposed adjacent to one end of the base layer BL and the connection lines SL (refer to FIG. 4A) respectively connected to the connection pads PD (refer to FIG. 4A).

The cover layer CL may be disposed on the conductive layer ML. The cover layer CL may contain a soft material. In an embodiment of the inventive concept, the cover layer CL may be provided in the form of a film. The cover layer CL may contain a polymer material. The cover layer CL may cover at least a portion of the conductive layer ML, protect the conductive layer ML, and prevent the conductive layer ML from being damaged by moisture, foreign substances, or the like.

The cover layer CL may expose a portion of the conductive layer ML. The portion of the conductive layer ML exposed by the cover layer CL may correspond to the aforementioned connection pads PD (refer to FIG. 4A). The conductive layer ML exposed by the cover layer CL may be electrically connected to the antenna layer AL. Specifically, the connection pads PD (refer to FIG. 4A) of the circuit board A-FPC exposed by the cover layer CL may be electrically connected to the antenna pads 430 (refer to FIG. 4A) of the antenna layer AL. The connection pads PD of the circuit board A-FPC exposed by the cover layer CL may be electrically connected to the antenna pads 430 of the antenna layer AL through a anisotropic conductive film, for example.

The upper surface of the conductive layer ML exposed by the cover layer CL may be disposed in the first partial surface B1 of the aforementioned first surface F-B of the circuit board A-FPC. Accordingly, the first partial surface B1 of the first surface F-B of the circuit board A-FPC may contact the antenna layer AL. The upper surface of the cover layer CL may correspond to the second partial surface B2 of the first surface F-B of the circuit board A-FPC. Accordingly, the upper surface of the conductive layer ML exposed by the cover layer CL and the upper surface of the cover layer CL may have a stepped portion having a step difference dd.

The second side surface S2 of the circuit board A-FPC may correspond to the side surface of the cover layer CL which is connected from the upper surface of the cover layer CL. The second surface S2 of the circuit board A-FPC may be disposed not to overlap the antenna layer AL in a plan view. Accordingly, the side surface of the cover layer CL may face the first side surface S1 of the antenna layer AL. That is, the stepped portion having the step difference dd between the upper surface of the cover layer CL and the upper surface of the conductive layer ML may face the first side surface S1 of the antenna layer AL. The stepped portion having the step difference dd between the upper surface of the cover layer CL and the upper surface of the conductive layer ML may contact the first side surface S1 of the antenna layer AL, for example, the stepped portion may directly contact the first side surface S1 of the antenna layer AL.

The circuit board A-FPC may include a first region AA1, a second region AA2, and a third region AA3 which are arranged in one direction. The first region AA1 of the circuit board A-FPC may overlap the first portion P1 of the antenna layer AL. The second region AA2 of the circuit board A-FPC may extend from the first region AA1 and be bent at a curvature with respect to the bending axis. The second region AA2 of the circuit board A-FPC may be defined as a bending region of the circuit board A-FPC. The third region AA3 of the circuit board A-FPC may extend from the second region AA2 and overlap the first region AA1 in the third direction DR3.

The cover layer CL, the conductive layer ML, and the base layer BL corresponding to the second region AA2 may be bent with respect to the bending axis. The second side surface S2 of the circuit board A-FPC may face the first side surface S1 of the antenna layer AL in the second region AA2. That is, the second side surface S2 of the circuit board A-FPC and the first side surface S1 of the antenna layer AL may respectively correspond to the end of a bent portion of the circuit board A-FPC and the end of a bent portion of the antenna layer AL.

Meanwhile, referring to FIG. 6B, a second side surface S2' of a circuit board A-FPC' according to a comparative embodiment of the inventive concept may be spaced apart from a first side surface S F of an antenna layer AL'. In the comparative embodiment of the inventive concept, the second side surface S2' of the circuit board A-FPC' may be positioned on a second portion P2' of the antenna layer AL'. That is, in the comparative embodiment of the inventive concept, a stepped portion having a step difference dd' of the circuit board A-FPC' may be spaced apart from the first side surface S1' of the antenna layer AL' and disposed to overlap the antenna layer AL'.

In the comparative embodiment of the inventive concept, the stepped portion of a cover layer CL' having the step difference dd' may be disposed to overlap the antenna layer AL'. As the conductive layer ML' and the cover layer CL' disposed on the conductive layer ML' are bent, stress may be concentrated in the conductive layer ML' disposed adjacent to the stepped portion having the step difference dd'. As a result, due to the occurrence of a crack in the conductive layer ML', a defect may occur in which the circuit board A-FPC' is disconnected.

However, as illustrated in FIG. 6A, as the stepped portion having the step difference dd in the circuit board A-FPC according to an embodiment of the inventive concept faces and/or contacts with the first side surface S1 of the antenna layer AL, when being bent, stress applied to a region disposed adjacent to the stepped portion having the step difference dd may be relieved. In particular, since stress applied to a portion of the conductive layer ML disposed adjacent to the stepped portion having the step difference dd is relieved, damage to the conductive layer ML may be prevented, and the reliability of the circuit board A-FPC according to an embodiment of the inventive concept may be improved.

Referring to the comparative embodiment of FIG. 6B, when the stepped portion having the step difference dd' of the circuit board A-FPC' is disposed on the antenna layer AL' to overlap the antenna layer AL', it is required that the second portion P2' of the antenna layer AL' extends lengthily along the second direction DR2 in order to closely connect the conductive layer ML' of the circuit board A-FPC' and the antenna layer AL' to each other. Accordingly, in the comparative embodiment of the inventive concept, as a portion of the antenna layer AL' on which the circuit board A-FPC' is disposed extends, the area of a bezel pattern WB' which prevents a corresponding portion from being visually recognized from the outside may also increase. That is, the area of the bezel region in the electronic apparatus ED' according to the comparative embodiment of the inventive concept may be increased compared to that of the embodiment of the inventive concept.

However, referring to FIG. 6A, in the circuit board A-FPC according to an embodiment of the inventive concept, the side surface of the cover layer CL is disposed to face and/or contact the first side surface S1 of the antenna layer AL, so that the conductive layer ML and the antenna layer AL may be closely connected to each other without increasing the area of the region of the antenna layer AL on which the circuit board A-FPC is disposed. Accordingly, in the electronic apparatus ED according to an embodiment of the inventive concept, the area of the bezel region may be reduced and a relatively wide display region may be provided to a user.

Figure 7:
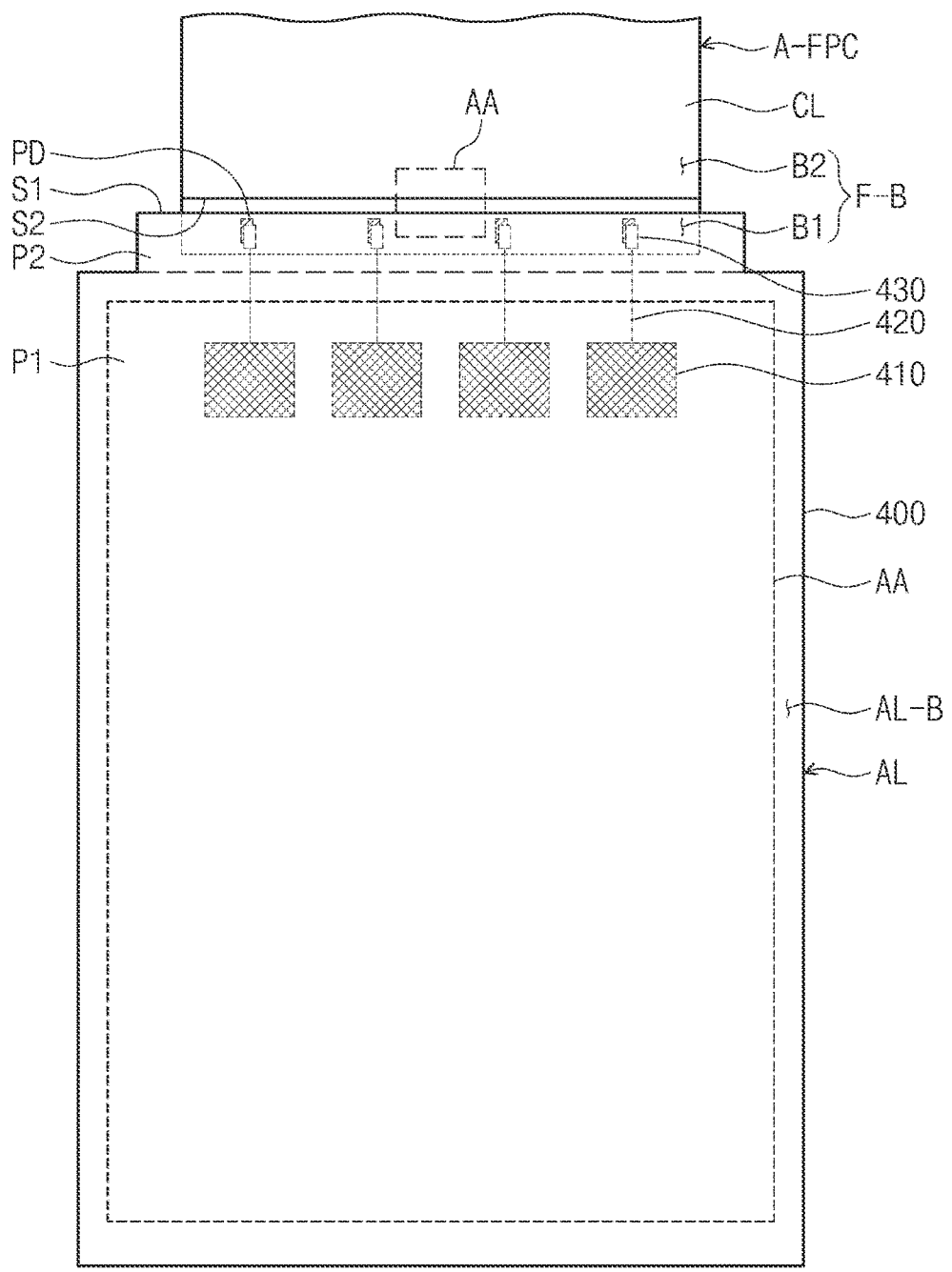
FIG. 7 is a plan view of an antenna layer according to an embodiment of the inventive concept.

FIG. 7 is a plan view of an antenna layer according to an embodiment of the inventive concept. FIGS. 8A to 8D are enlarged plan views of an antenna layer corresponding to region AA of FIG. 7 according to an embodiment of the inventive concept. The aforementioned description may be equally applied to each element illustrated in FIG. 7.

FIG. 7 is a brief plan view illustrating an antenna layer AL viewed from above the lower surface AL-B opposite to the upper surface AL-U (refer to FIG. 4A) of the base film 400, which is parallel to each of the first and second directions DR1 and DR2. For the convenience of understanding, FIG. 7 illustrates antennas 410, antenna lines 420, and antenna pads 430 which are disposed on the upper surface AL-U (refer to FIG. 4A) of the base film 400.

Referring to FIG. 7, prior to being bent, the circuit board A-FPC may include a first surface F-B parallel to each of the first direction DR1 and the second direction DR2, and the first surface F-B of the circuit board A-FPC may include a first partial surface B1 contacting the antenna layer AL and a second partial surface B2 spaced apart from the antenna layer AL.

On the first surface F-B of the circuit board A-FPC, the first side surface S1 of the antenna layer AL and the second side surface S2 of the circuit board A-FPC may face each other in the second direction DR2. FIG. 7 illustrates that the first side surface S1 of the antenna layer AL and the second side surface S2 of the circuit board A-FPC face and are spaced apart from each other in the second direction DR2. However, the embodiment of the inventive concept is not limited thereto, and the first side surface S1 of the antenna layer AL and the second side surface S2 of the circuit board A-FPC may contact each other in the second direction DR2.

The first side surface S1 of the antenna layer AL and the second side surface S2 of the circuit board A-FPC may be provided as flat surfaces parallel to each of the first direction DR1 and the third direction DR3. However, the embodiment of the inventive concept is not limited thereto, and as illustrated in FIGS. 8A to 8D, each of the first side surface S1 of the antenna layer AL and the second side surface S2 of the circuit board A-FPC may include a plurality of grooves GV1 and GV2.

Referring to FIGS. 8A to 8D, the first side surface S1 of the antenna layer AL may include a plurality of first grooves GV1 and the second side surface S2 of the circuit board A-FPC may include a plurality of second grooves GV2. The first side surface S1 and the second side surface S2 respectively including the plurality of grooves GV1 and GV2 may face each other in the second direction DR2.

The shapes of the plurality of first grooves GV1 may correspond to the shapes of the plurality of second grooves GV2. That is, the plurality of first grooves GV1 may have a shape that engages with the plurality of second grooves GV2 in the second direction DR2. Specifically, the plurality of first grooves GV1 may include a portion protruding toward the cover layer CL of the circuit board A-FPC in the second direction DR2, and the plurality of second grooves GV2 may have a recessed portion corresponding to the protruding portion of the plurality of first grooves GV1 in the second direction DR2. Likewise, the plurality of first grooves GV1 may include a portion recessed toward the center of the base film 400 in the second direction DR2, and the plurality of second grooves GV2 may have a portion corresponding thereto and protruding toward the antenna layer AL (refer to FIG. 7) in the second direction DR2.

The plurality of first grooves GV1 and the plurality of second grooves GV2 may face and be spaced apart from each other in the second direction DR2. FIGS. 8A to 8D illustrate the first side surface S1 and the second side surface S2 which face and are spaced apart from each other in the second direction DR2. However, the embodiment of the inventive concept is not limited thereto, and the plurality of first grooves GV1 and the plurality of second grooves GV2 may engage with and contact with each other.

Each of the plurality of first and second grooves GV1 and GV2 may include a curved surface. However, the embodiment of the inventive concept is not limited thereto, and the plurality of first and second grooves GV1 and GV2 may include planes which are bent and connected to each other.

Figure 8A:
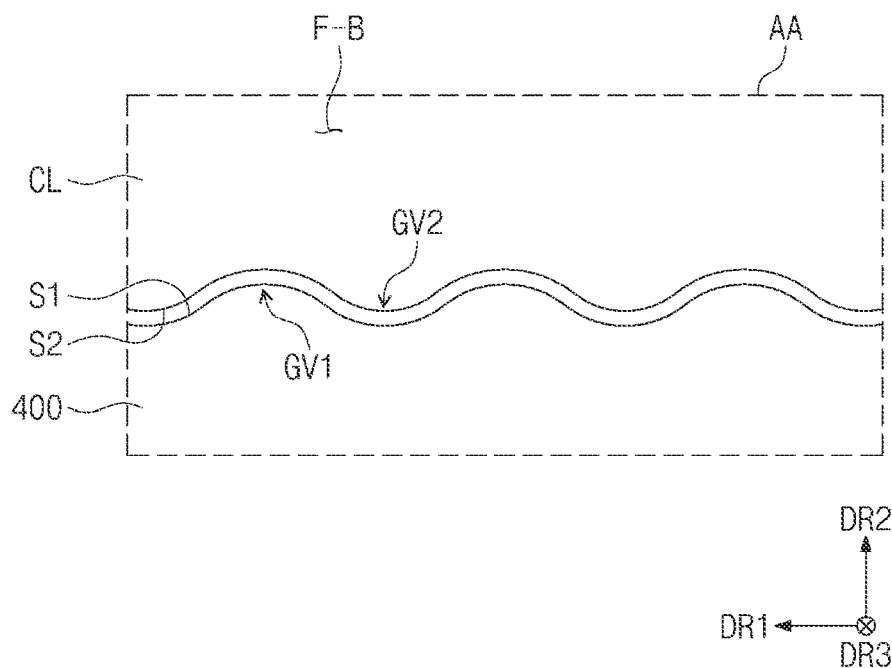
FIGS. 8A, 8B, 8C and 8D are enlarged plan views of an antenna layer corresponding to region AA of FIG. 7 according to an embodiment of the inventive concept.

For example, referring to FIG. 8A, each of the plurality of first and second grooves GV1 and GV2 may have a semi-arc shape on the first surface F-B of the circuit board A-FPC (refer to FIG. 7). Each of the plurality of first and second grooves GV1 and GV2 may have a shape in which concave or convex semi-arcs are repeated along the first direction DR1 on the first surface F-B of the circuit board A-FPC (refer to FIG. 7).

Figure 8B:
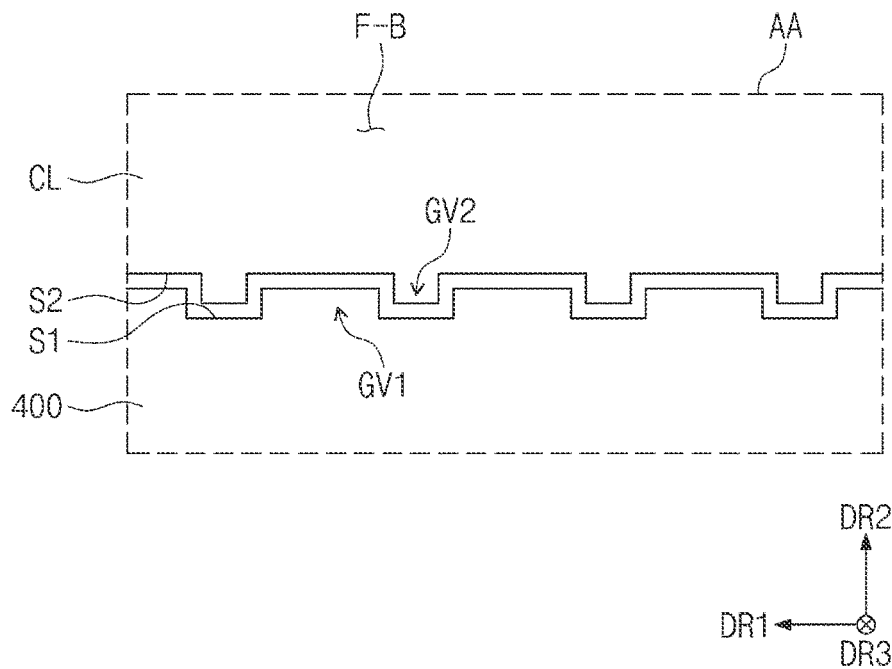

Referring to FIG. 8B, each of the plurality of first and second grooves GV1 and GV2 may have a tetragonal shape on the first surface F-B of the circuit board A-FPC (refer to FIG. 7). The plurality of first and second grooves GV1 and GV2 may include planes which are bent to have a right angle therebetween. Without being limited thereto, referring to FIG. 8C, each of the plurality of first and second grooves GV1 and GV2 may include curved surfaces connecting the planes which are bent to substantially have a right angle therebetween. That is, the plurality of first and second grooves GV1 and GV2 may have rounded corners on the first surface F-B of the circuit board A-FPC (refer to FIG. 7).

Figure 8C:
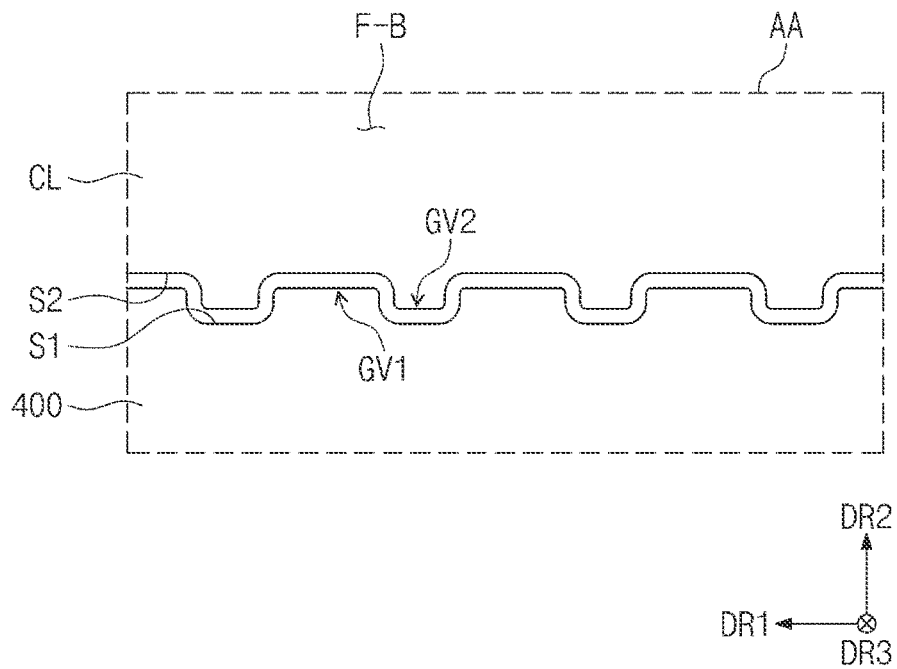

Referring to FIGS. 8B and 8C, a width in the first direction DR1 of a portion protruding toward the conductive layer CL of the circuit board A-FPC (refer to FIG. 7) in the second direction DR2 among the plurality of first grooves GV1 may be greater than a width in the first direction DR1 of a portion protruding toward the base film 400 of the antenna layer AL (refer to FIG. 7) in the second direction DR2 among the plurality of second grooves GV2. However, the embodiment of the inventive concept is not limited thereto, and the width of the protruding portion of the plurality of first grooves GV1 may be substantially equal to or smaller than the width of the protruding portion of the plurality of second grooves GV2.

Figure 8D:
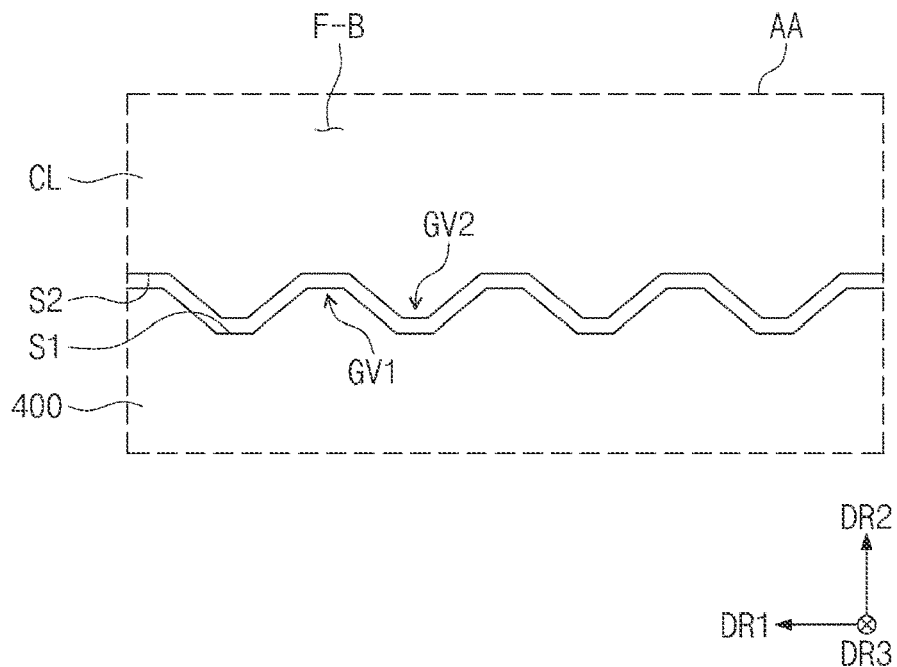

Referring to FIG. 8D, each of the plurality of first and second grooves GV1 and GV2 may have a trapezoidal shape on the first surface F-B of the circuit board A-FPC (refer to FIG. 7). The plurality of first and second grooves GV1 and GV2 may include planes which are bent to have an obtuse angle therebetween. The plurality of first and second grooves GV1 and GV2 illustrated in FIG. 8D may have angled or rounded corners on the first surface F-B of the circuit board A-FPC (refer to FIG. 7). Without being limited to what is illustrated in FIG. 8D, each of the plurality of first and second grooves GV1 and GV2 according to an embodiment of the inventive concept may have an inverted trapezoidal shape on the first surface F-B of the circuit board A-FPC (refer to FIG. 7), and the plurality of first and second grooves GV1 and GV2 may include planes which are bent to have an acute angle therebetween.

As the first side surface S1 of the antenna layer AL and the second side surface S2 of the circuit board A-FPC respectively have the plurality of grooves GV1 and GV2, the first side surface S1 and the second side surface S2 may be in close contact with each other. Accordingly, stress applied to the circuit board A-FPC during bending may be more effectively relieved.

Meanwhile, FIGS. 8A to 8D illustrate the shapes of the plurality of first and second grooves GV1 and GV2, and the shapes of the plurality of first and second grooves GV1 and GV2 are not limited to any one embodiment as long as they are formed by engaging with each other.

The electronic apparatus according to an embodiment of the inventive concept may include an antenna layer configured to support wireless communication and a circuit board connected to the antenna layer to transmit a driving signal. One surface of the circuit board may include a stepped portion having a step difference, and the stepped portion having the step difference may face, or face and come in contact with one side of the antenna layer. Therefore, when portions of the antenna layer and the circuit board are bent, stress applied to the stepped portion having the step difference of the circuit board may be relieved, and cracks may be prevented from occurring in the circuit board, thereby reducing defects in the circuit board. In an embodiment of the inventive concept, the stepped portion having the step difference of the circuit board and one side surface of the antenna layer may respectively include grooves that engage with and come in contact with each other, and accordingly, stress applied to the bent circuit board may be more effectively relieved so as to prevent damage to the circuit board.

The electronic apparatus according to an embodiment of the inventive concept may include an antenna layer and a circuit board that are bent and connected to each other, and as an impact applied by bending is alleviated, damage to and defects in the circuit board and the antenna layer may be prevented. Accordingly, it is possible to improve the reliability of the electronic apparatus.

The electronic apparatus according to an embodiment of the inventive concept may include an antenna layer having a reduced area of a bent region, and therefore, the area of the bezel region of the electronic apparatus may be reduced.

Although the above has been described with reference to preferred embodiments of the inventive concept, those skilled in the art or those of ordinary skill in the art will understand that various modifications and changes can be made to the inventive concept within the scope that does not depart from the spirit and technical field of the inventive concept described in the claims to be described later.

Accordingly, the technical scope of the inventive concept should not be limited to the content described in the detailed description of the specification, but should be determined by the claims as hereinafter described.

What is claimed is:

1. An electronic apparatus comprising:
    a display panel comprising a display region;
    an antenna layer disposed on the display panel and comprising:
        a base film;
        a plurality of antennas disposed on the base film in the display region;
        a plurality of antenna pads disposed on the base film, not overlapping the display region; and
        a plurality of antenna lines electrically connecting the plurality of antennas respectively to the corresponding plurality of antenna pads; and
    a circuit board connected to the antenna layer and comprising:
        a base layer;
        a conductive layer disposed on the base layer; and
        a cover layer disposed on the conductive layer, partially overlapping the conductive layer, and partially facing the display panel,
    wherein a surface of the conductive layer not overlapped by cover layer is contact with the plurality of antenna pads, and
    wherein a side surface of the cover layer facing a side surface of the base film.

2. The electronic apparatus of claim 1, wherein:
    the side surface of the base film comprises a plurality of first grooves; and
    the side surface of the cover layer comprises a plurality of second grooves.

3. The electronic apparatus of claim 2, wherein each of the plurality of first grooves and the plurality of second grooves comprises a curved surface.

4. The electronic apparatus of claim 2, wherein the plurality of first grooves and the plurality of second grooves have a polygonal shape.

5. The electronic apparatus of claim 2, wherein the plurality of first grooves engage with the plurality of second grooves.

6. The electronic apparatus of claim 1, further comprising a plurality of sensing electrodes disposed on the display panel, wherein the plurality of antennas overlap the plurality of sensing electrodes.

7. The electronic apparatus of claim 1, further comprising a plurality of sensing electrodes disposed on the display panel, wherein the plurality of antennas are disposed on the same layer as at least a portion of the plurality of sensing electrodes.

8. The electronic apparatus of claim 1, wherein:
    the antenna layer comprises a bent portion which is bent at a curvature; and
    the side surface of the base film corresponds to an end of the bent portion.

9. The electronic apparatus of claim 1, wherein the circuit board is bent so that at least a portion of the circuit board overlaps the display panel.

10. The electronic apparatus of claim 1, wherein the side surface of the base film is in direct contact with the side surface of the cover layer.

11. The electronic apparatus of claim 1, wherein:
the circuit board includes a stepped portion defined between the side surface of the cover layer and the surface of the conductive layer not overlapped by cover layer; and
the stepped portion faces the base film.

\* \* \* \* \*